US012666800B2

(12) United States Patent
Zhao et al.

(10) Patent No.: US 12,666,800 B2
(45) Date of Patent: Jun. 23, 2026

(54) DISPLAY SUBSTRATE AND PREPARATION METHOD THEREFOR, AND DISPLAY APPARATUS

(71) Applicant: BOE Technology Group Co., Ltd., Beijing (CN)

(72) Inventors: Dejiang Zhao, Beijing (CN); Xiaojie Pan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 692 days.

(21) Appl. No.: 18/021,163

(22) PCT Filed: Mar. 9, 2022

(86) PCT No.: PCT/CN2022/079992
§ 371 (c)(1),
(2) Date: Feb. 13, 2023

(87) PCT Pub. No.: WO2022/267556
PCT Pub. Date: Dec. 29, 2022

(65) Prior Publication Data
US 2023/0247866 A1 Aug. 3, 2023

(30) Foreign Application Priority Data
Jun. 24, 2021 (CN) .......................... 202110707887.8

(51) Int. Cl.
*H10K 59/122* (2023.01)
*H10K 59/12* (2023.01)
(52) U.S. Cl.
CPC ....... *H10K 59/122* (2023.02); *H10K 59/1201* (2023.02)

(58) Field of Classification Search
None
See application file for complete search history.

(56) References Cited

U.S. PATENT DOCUMENTS 8,829,509 B2 * 9/2014 Nakatani .............. H10K 59/173
257/40
9,773,848 B2 * 9/2017 Shinokawa .......... H10K 59/122
(Continued)

FOREIGN PATENT DOCUMENTS

CN 102217420 A 10/2011
CN 106067478 A 11/2016
(Continued)

OTHER PUBLICATIONS

International Search Report for PCT/CN2022/079992 Dated May 18, 2022.

*Primary Examiner* — Nishath Yasmeen
(74) *Attorney, Agent, or Firm* — Ling Wu; Stephen Yang; Ling and Yang Intellectual Property

(57) ABSTRACT

Provided in the present disclosure are a display substrate and a preparation method therefor, and a display apparatus. The display substrate comprises a plurality of first pixel definition structures, second pixel definition structures, and third pixel definition structures; the first pixel definition structures each have an elongated shape extending along a first direction and are sequentially arranged along a second direction; the second pixel definition structures are disposed at intervals between the first pixel definition strictures, and at least one third pixel definition structure is disposed between the first pixel definition structures and the second pixel definition structures; and the height of the third pixel definition structures is less than the height of the second pixel definition structures.

20 Claims, 14 Drawing Sheets

(56) References Cited

U.S. PATENT DOCUMENTS

| 2009/0008667 | A1* | 1/2009 | Fujii | .................... | H10K 71/135 |
| | | | | | 438/22 |
| 2009/0160322 | A1* | 6/2009 | Yoshida | ............... | H10K 59/173 |
| | | | | | 313/504 |
| 2011/0260955 | A1 | 10/2011 | Yoshida et al. | | |
| 2020/0161391 | A1 | 5/2020 | Zhang et al. | | |
| 2021/0376018 | A1 | 12/2021 | Luo et al. | | |

FOREIGN PATENT DOCUMENTS

| CN | 107393939 | A | 11/2017 |
| CN | 107819017 | A | 3/2018 |
| CN | 109801939 | A | 5/2019 |
| CN | 215578569 | U | 1/2022 |
| JP | 2007-227127 | A | 9/2007 |

* cited by examiner

DISPLAY SUBSTRATE AND PREPARATION METHOD THEREFOR, AND DISPLAY APPARATUS

CROSS-REFERENCE TO RELATED APPLICATIONS

The present application is a U.S. National Phase Entry of International Application No. PCT/CN2022/079992 having an international filing date of Mar. 9, 2022, which claims priority to Chinese Patent Application No. 202110707887.8 filed to the CNIPA on Jun. 24, 2021 and entitled "Display Substrate and Preparation Method therefor, and Display Apparatus". The entire contents of the above-identified applications are hereby incorporated by reference.

TECHNICAL FIELD

The present disclosure relates to the field of display technologies, and particularly, to a display substrate and a preparation method therefor, and a display apparatus.

BACKGROUND

An Organic Light Emitting Diode (OLED) is an active light emitting display device, which has advantages of auto-luminescence, a wide viewing angle, a high contrast ratio, low power consumption, an extremely high response speed, lightness and thinness, bendability, and a low cost, etc. With continuous development of display technologies, a display apparatus using an OLED as a light emitting device and using a Thin Film Transistor (TFT) for signal control has become a mainstream product in the field of display at present.

SUMMARY

The following is a summary of subject matters described herein in detail. The summary is not intended to limit the protection scope of claims.

An exemplary embodiment of the present disclosure provides a display substrate including a base substrate and a pixel definition layer disposed on the base substrate; the pixel definition layer includes a plurality of first pixel definition structures, a plurality of second pixel definition structures, and a plurality of third pixel definition structures; a first pixel definition structure has a long strip shape extending along a first direction, the plurality of first pixel definition structures are arranged sequentially along a second direction, and the first direction and the second direction are intersected; a second pixel definition structure has a long strip shape extending along the second direction, the plurality of second pixel definition structures are disposed at intervals between adjacent first pixel definition structures; at least one third pixel definition structure is disposed between the first pixel definition structure and the second pixel definition structure; in a direction perpendicular to the base substrate, a height of the third pixel definition structure is less than a height of the second pixel definition structure.

In an exemplary implementation mode, the height of the second pixel definition structures is less than a height of the first pixel definition structure in a direction perpendicular to the base substrate.

In an exemplary implementation mode, a height of the first pixel definition structure is 1.0 μm to 2.0 μm in the direction perpendicular to the base substrate.

In an exemplary implementation mode, the height of the second pixel definition structure is 0.3 μm to 0.8 μm in the direction perpendicular to the base substrate.

In an exemplary implementation mode, the height of the third pixel definition structure is 0.1 μm to 0.3 μm in the direction perpendicular to the base substrate.

In an exemplary implementation mode, there is a first distance between an edge of the first pixel definition structure close to the second pixel definition structure and an end face of the second pixel definition structure close to the first pixel definition structure, and the first distance is greater than or equal to 2 μm.

In an exemplary implementation mode, in a plane perpendicular to the first direction, a cross-sectional shape of the first pixel definition structure is a first trapezoid, a width of an upper bottom of the first trapezoid is greater than or equal to 15 μm, and a first slope angle of a side edge of the first trapezoid is 30° to 70°; in a plane perpendicular to the second direction, a cross-sectional shape of the second pixel definition structure is a second trapezoid, a width of an upper bottom of the second trapezoid is greater than or equal to 3 μm, and a second slope angle of a side edge of the second trapezoid is 30° to 90°.

In an exemplary implementation mode, lyophobic property of the first pixel definition structure is stronger than that of the second pixel definition structure, and lyophobic property of the second pixel definition structure is stronger than that of the third pixel definition structure.

In an exemplary implementation mode, a material of the third pixel definition structure includes a lyophilic inorganic material, or includes a lyophilic organic material.

In an exemplary implementation mode, there is a first overlap region between an orthographic projection of the first pixel definition structure on the base substrate and an orthographic projection of the third pixel definition structure on the base substrate, and a first overlap width of the first overlap region is 1 μm to 3 μm in the second direction.

In an exemplary implementation mode, there is a second overlap region between an orthographic projection of the second pixel definition structure on the base substrate and an orthographic projection of the third pixel definition structure on the base substrate, and a second overlap width of the second overlap region is 1 μm to 3 μm in the second direction.

In an exemplary implementation mode, the first pixel definition structure and the third pixel definition structure are interconnected to be of an integral structure.

In an exemplary implementation mode, a first side edge of the first pixel definition structure on a side away from the second pixel definition structure has a first slope angle, a third side edge of the first pixel definition structure on a side away from the first side edge has a third slope angle, and the first slope angle is greater than the third slope angle.

In an exemplary implementation mode, the second pixel definition structure and the third pixel definition structure are interconnected to be of an integral structure.

In an exemplary implementation mode, the third pixel definition structure includes at least two mutually isolated sub-definition structures, and the at least two sub-definition structures are arranged sequentially along the first direction.

In an exemplary implementation mode, an orthographic projection of at least one sub-definition structure on the base substrate is at least partially overlapped with an orthographic projection of the first pixel definition structure on the base substrate, and/or an orthographic projection of at least one sub-definition structure on the base substrate is at least partially overlapped with an orthographic projection of the second pixel definition structure on the base substrate.

In an exemplary implementation mode, an orthographic projection of at least one sub-definition structure on the base substrate is not overlapped with an orthographic projection of the first pixel definition structure on the base substrate, and/or an orthographic projection of at least one sub-definition structure on the base substrate is not overlapped with an orthographic projection of the second pixel definition structure on the base substrate.

In an exemplary implementation mode, the display substrate further includes an organic emitting layer, the organic emitting layer is disposed within an open region defined by the first pixel definition structure and the second pixel definition structure, and the organic emitting layer covers the third pixel definition structure.

An exemplary embodiment of the present disclosure also provides a display apparatus, including the display substrate described above.

An exemplary embodiment of the present disclosure also provides a preparation method of a display substrate, including: forming a pixel definition layer on a base substrate; wherein the pixel definition layer includes a plurality of first pixel definition structures, a plurality of second pixel definition structures, and a plurality of third pixel definition structures; a first pixel definition structure has a long strip shape extending along a first direction, the plurality of first pixel definition structures are arranged sequentially along a second direction, and the first direction and the second direction are intersected; a second pixel definition structure has a long strip shape extending along the second direction, the plurality of second pixel definition structures are disposed at intervals between adjacent first pixel definition structures; at least one third pixel definition structure is disposed between the first pixel definition structure and the second pixel definition structure; a height of the third pixel definition structure is less than a height of the second pixel definition structure in a direction perpendicular to the base substrate.

Other aspects may be understood upon reading and understanding drawings and detailed description.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure, but do not constitute a limitation on the technical solutions of the present disclosure. Shapes and sizes of various components in the drawings do not reflect actual scales, but are only intended to schematically illustrate contents of the present disclosure.

Figure 1:
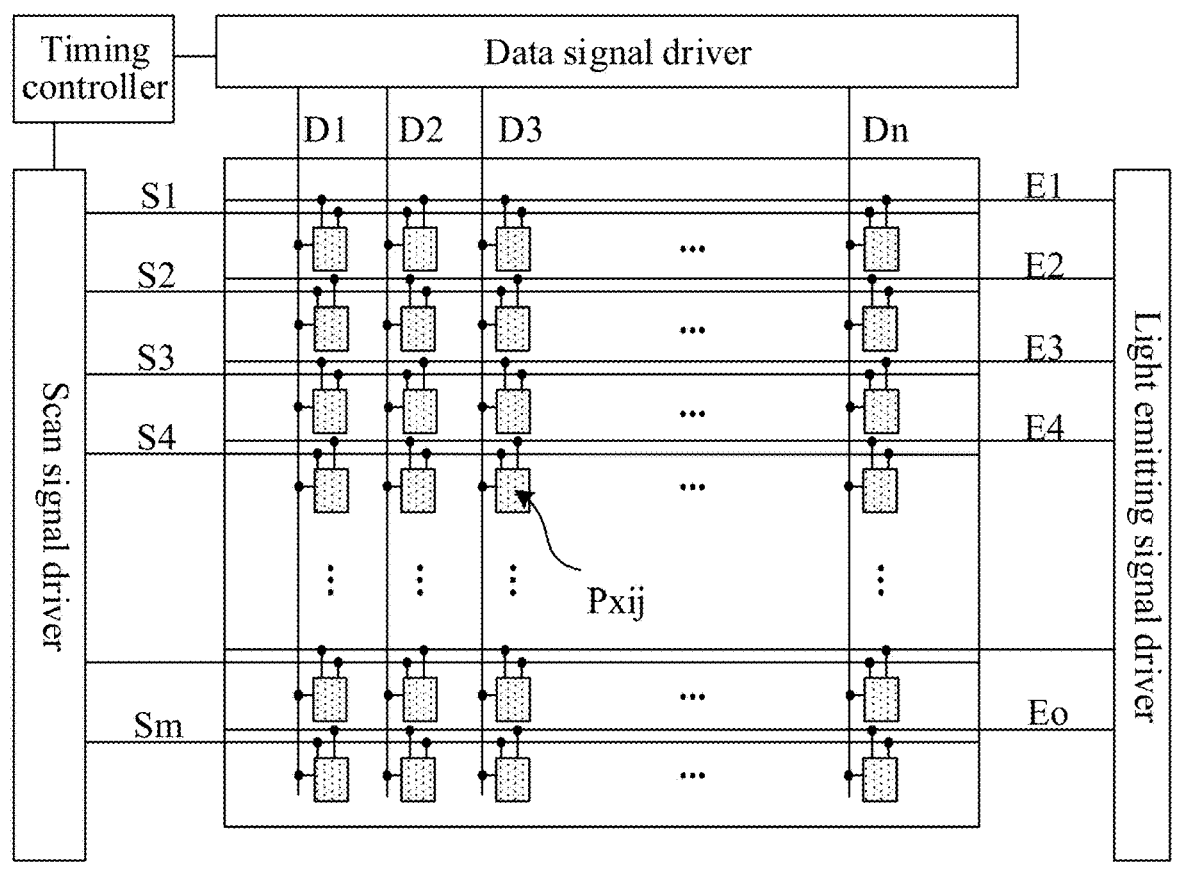
FIG. 1 is a schematic diagram of a structure of a display apparatus.

Description of reference signs is as follows.

| 10 - first pixel definition structure; | 20 - second pixel definition structure; | 30 - third pixel definition structure; |
| --- | --- | --- |
| 31 - sub-definition structure; | 40 - light emitting region; | 101 - base substrate; |
| 101A - transistor; | 102B - storage capacitor; | 102 - drive circuit layer; |
| 103 - light emitting structure layer; | 104 - encapsulation layer; | 200 - pixel definition layer; |
| 301 - anode; | 302 - pixel definition layer; | 303 - organic emitting layer; |
| 304 - cathode; | 401 - first encapsulation layer; | 402 - second encapsulation layer; |

-continued

| 403 - third encapsulation layer. |
| --- |

DETAILED DESCRIPTION

To make objectives, technical solutions, and advantages of the present disclosure clearer, the embodiments of the present disclosure will be described in detail with reference to the accompanying drawings. It is to be noted that implementation modes may be implemented in a plurality of different forms. Those of ordinary skills in the art may easily understand such a fact that modes and contents may be transformed into various forms without departing from the purpose and scope of the present disclosure. Therefore, the present disclosure should not be explained as being limited to contents described in following implementation modes only. The embodiments in the present disclosure and features in the embodiments may be combined arbitrarily with each other without conflict. In order to keep following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to usual designs.

A scale of the drawings in the present disclosure may be used as a reference in an actual process, but it is not limited thereto. For example, a width-length ratio of a channel, a thickness and a pitch of each film layer, and a width and a pitch of each signal line may be adjusted according to actual needs. A quantity of pixels in a display substrate and a quantity of sub-pixels in each pixel are not limited to numbers shown in the drawings. The drawings described in the present disclosure are schematic diagrams of structures only, and one mode of the present disclosure is not limited to shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, or a detachable connection, or an integrated connection. It may be a mechanical connection or an electrical connection. It may be a direct mutual connection, or an indirect connection through middleware, or internal communication between two elements. Those of ordinary skill in the art may understand specific meanings of these terms in the present disclosure according to specific situations.

In the specification, a transistor refers to an element which includes at least three terminals: a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a direction of a current is changed during operation of a circuit, or the like, and functions of the "source electrode" and the "drain electrode" are sometimes interchangeable. Therefore, the "source electrode" and the "drain electrode" are interchangeable in the specification.

In the specification, an "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switching elements such as transistors, resistors, inductors, capacitors, and other elements with various functions, etc.

In the specification, "parallel" refers to a state in which an angle formed by two straight lines is above $-10°$ and below $10°$, and thus also includes a state in which the angle is above $-5°$ and below $5°$. In addition, "perpendicular" refers to a state in which an angle formed by two straight lines is above $80°$ and below $100°$, and thus also includes a state in which the angle is above $85°$ and below $95°$.

In the specification, a "film" and a "layer" are interchangeable. For example, a "conductive layer" may be replaced with a "conductive film" sometimes. Similarly, an "insulation film" may be replaced with an "insulation layer" sometimes.

A triangle, rectangle, trapezoid, pentagon, hexagon, or the like in this specification is not strictly defined, and may be an approximate triangle, rectangle, trapezoid, pentagon, hexagon, or the like, there may be some small deformation caused by tolerance, and there may be a chamfer, an arc edge, and deformation, etc.

In the present disclosure, "about" refers to that a boundary is defined not so strictly and numerical values within process and measurement error ranges are allowed.

FIG. 1 is a schematic diagram of a structure of a display apparatus. As shown in FIG. 1, the display apparatus may include a timing controller, a data driver, a scan driver, a light emitting driver, and a pixel array. The timing controller is connected with the data driver, the scan driver, and the light emitting driver respectively, the data driver is connected with a plurality of data signal lines (D1 to Dn) respectively, the scan driver is connected with a plurality of scan signal lines (S1 to Sm) respectively, and the light emitting driver is connected with a plurality of light emitting signal lines (E1 to Eo) respectively. The pixel array may include a plurality of sub-pixels Pxij, i and j may be natural numbers, at least one sub-pixel Pxij may include a circuit unit and a light emitting device connected with the circuit unit, and the circuit unit may include at least one scan signal line, at least one data signal line, at least one light emitting signal line, and a pixel drive circuit. In an exemplary implementation mode, the timing controller may provide a gray value and a control signal, which are suitable for a specification of the data driver, to the data driver, may provide a clock signal, a scan start signal, etc., which are suitable for a specification of the scan driver, to the scan driver, and may provide a clock signal, an emission stop signal, etc., which are suitable for a specification of the light emitting driver, to the light emitting driver. The data driver may generate a data voltage to be provided to the data signal lines D1, D2, D3, . . . , and Dn by using the gray value and the control signal that are received from the timing controller. For example, the data driver may sample the gray value by using the clock signal and apply a data voltage corresponding to the gray value to the data signal lines D1 to Dn by taking a pixel row as a unit, wherein n may be a natural number. The scan driver may receive the clock signal, the scan start signal, etc., from the timing controller to generate a scan signal to be provided to the scan signal lines S1, S2, S3, . . . , and Sm. For example, the scan driver may provide a scan signal with an on-level pulse to the scan signal lines S1 to Sm sequentially. For example, the scan driver may be constructed in a form of a shift register and may generate a scan signal in a manner in which the scan start signal provided in a form of an on-level pulse is transmitted to a next-stage circuit sequentially under control of a clock signal, wherein m may be a natural number. The light emitting driver may receive a clock signal, an emission stop signal, etc., from the timing controller to generate an emission signal to be provided to the light emitting signal lines E1, E2, E3, . . . , and Eo. For example, the light emitting driver may provide an emission signal with an off-level pulse to the light emitting signal lines E1 to Eo sequentially. For example, the light emitting driver may be constructed in a form of a shift register and may generate an emission signal in a manner in which an emission stop signal provided in a form of an off-level pulse is transmitted to a next-stage circuit sequentially under control of a clock signal, wherein o may be a natural number.

Figure 2:
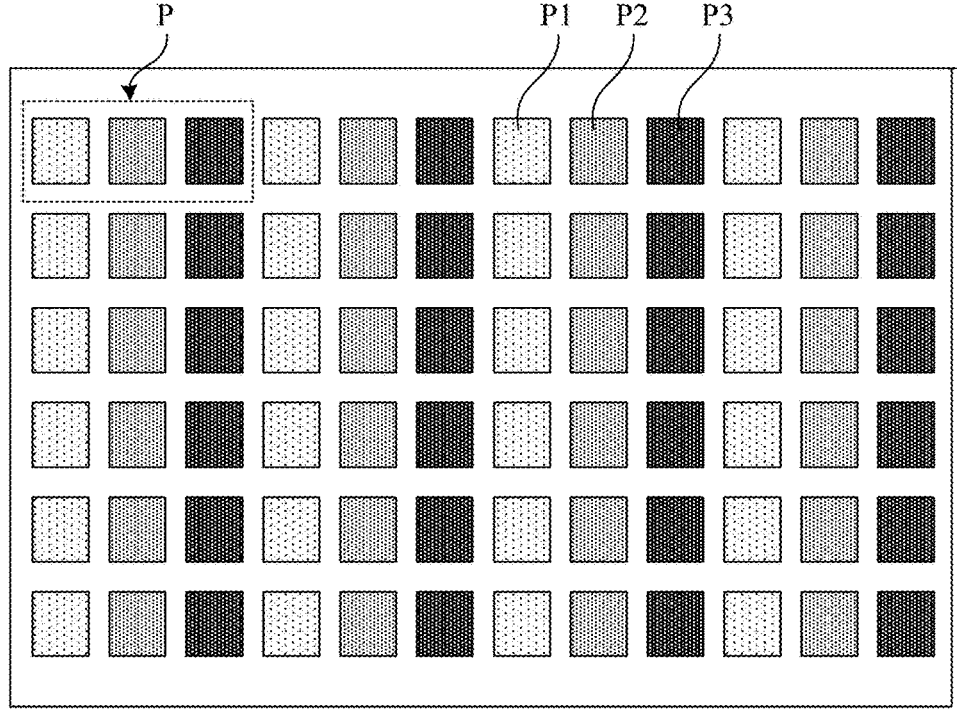
FIG. 2 is a schematic diagram of a planar structure of a display substrate.

FIG. 2 is a schematic diagram of a planar structure of a display substrate. As shown in FIG. 2, the display substrate may include multiple pixel units P arranged in a matrix, at least one of the multiple pixel units P includes a first sub-pixel P1 emitting light of a first color, a second sub-pixel P2 emitting light of a second color, and a third sub-pixel P3 emitting light of a third color. The first sub-pixel P1, the second sub-pixel P2, and the third sub-pixel P3 each include a pixel drive circuit and a light emitting device. Pixel drive circuits in the first sub-pixel P1, the second sub-pixel P2, and the third sub-pixel P3 are connected with a scan signal line, a data signal line, and a light emitting signal line respectively. A pixel drive circuit is configured to receive a data voltage transmitted by a data signal line under control of a scan signal line and a light emitting signal line, and output a corresponding current to a light emitting device. Each light emitting device in the first sub-pixel P1, the second sub-pixel P2, and the third sub-pixel P3 is respectively connected with a pixel drive circuit of a sub-pixel where the light emitting device is located, and is configured to emit light with corresponding brightness in response to a current output by the pixel drive circuit of the sub-pixel where the light emitting device is located.

In an exemplary implementation mode, a pixel unit P may include a Red (R) sub-pixel, a Green (G) sub-pixel, and a Blue (B) sub-pixel, or may include a red sub-pixel, a green sub-pixel, a blue sub-pixel, and a white sub-pixel, which is not limited in the present disclosure. In an exemplary implementation mode, a shape of a sub-pixel in a pixel unit may be a rectangle, a rhombus, a pentagon, or a hexagon. When the pixel unit includes three sub-pixels, the three sub-pixels may be arranged side by side horizontally, side by side vertically, or in a manner like a Chinese character "品", and when the pixel unit includes four sub-pixels, the four sub-pixels may be arranged side by side horizontally, side by side vertically, or in a manner to form a square, which is not limited in the present disclosure.

Figure 3:
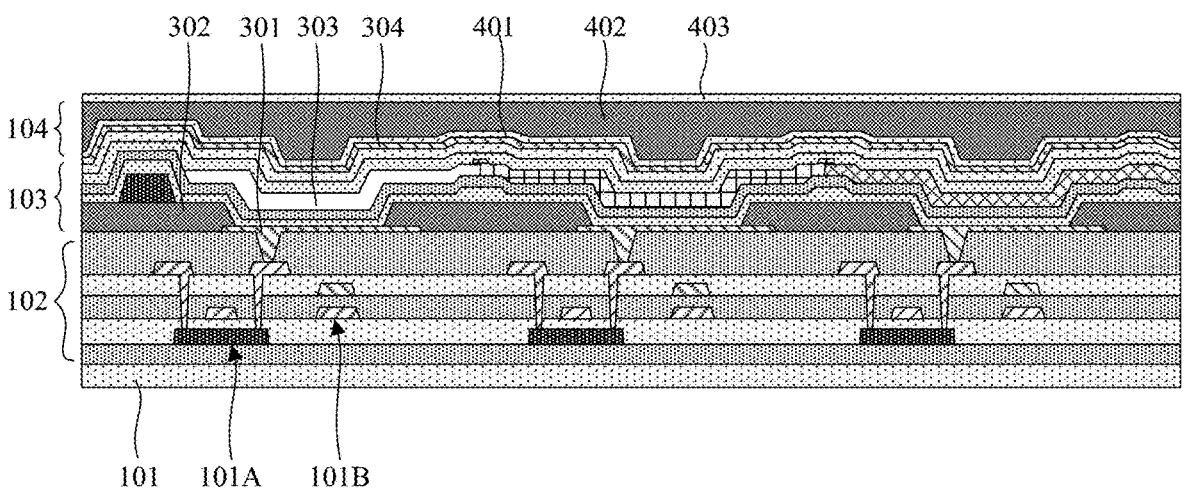
FIG. 3 is a schematic diagram of a cross-sectional structure of a display substrate.

FIG. 3 is a schematic diagram of a cross-sectional structure of a display substrate, which illustrates a structure of three sub-pixels of an OLED display substrate. As shown in FIG. 3, on a plane perpendicular to the display substrate, the display substrate may include a drive circuit layer 102 disposed on a base substrate 101, a light emitting structure layer 103 disposed on a side of the drive circuit layer 102 away from the base substrate 101, and an encapsulation layer 104 disposed on a side of the light emitting structure layer 103 away from the base substrate 101. In some possible implementation modes, the display substrate may include another film layer, such as a post spacer, which is not limited in the present disclosure.

In an exemplary implementation mode, the base substrate 101 may be a flexible base substrate, or a rigid base substrate. A drive circuit layer 102 of each sub-pixel may include a plurality of transistors and a storage capacitor that form a pixel drive circuit. In FIG. 3, only one transistor 101A and one storage capacitor 101B are taken as an example. The light emitting structure layer 103 may include an anode 301, a pixel definition layer 302, an organic emitting layer 303, and a cathode 304. The anode 301 is connected with a drain electrode of a drive transistor 101A through a via. The organic emitting layer 303 is connected with the anode 301. The cathode 304 is connected with the organic emitting layer 303. The organic emitting layer 303 is driven by the anode 301 and the cathode 304 to emit light of a corresponding color. The encapsulation layer 104 may include a first encapsulation layer 401, a second encapsulation layer 402, and a third encapsulation layer 403 that are stacked, the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403 so as to prevent external water vapor from entering the light emitting structure layer 103.

Figure 4:
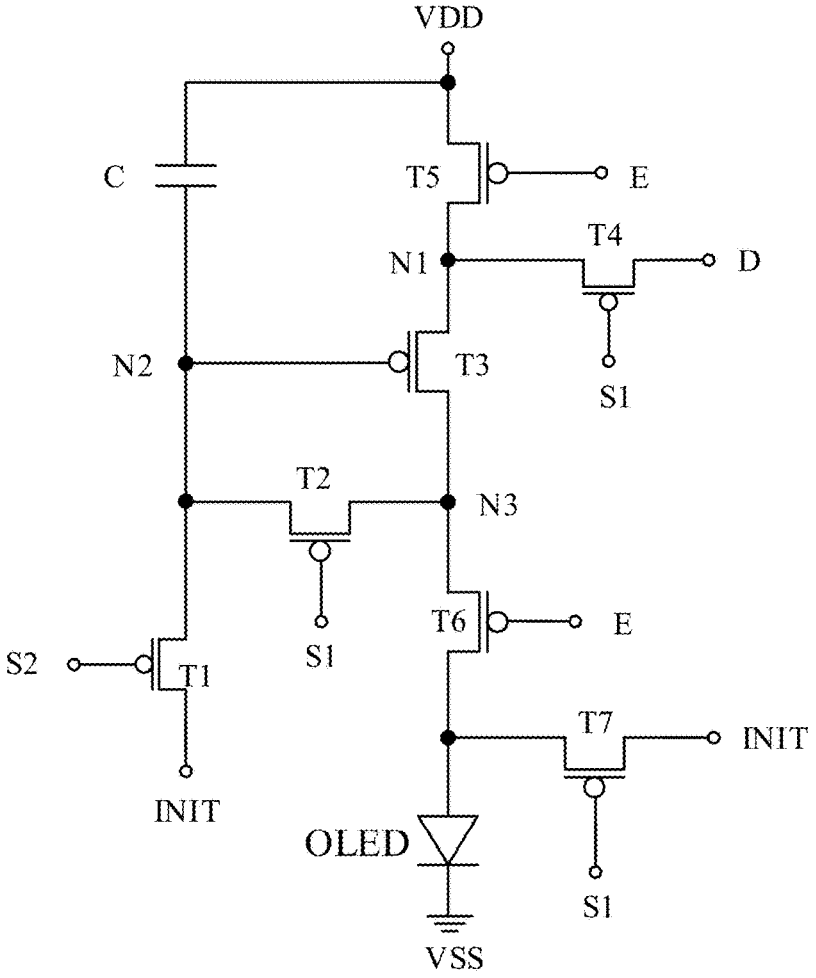
FIG. 4 is a schematic diagram of an equivalent circuit of a pixel drive circuit.

In an exemplary implementation mode, the pixel drive circuit may be in a 3T1C, 4T1C, 5T1C, 5T2C, 6T1C, or 7T1C structure. FIG. 4 is a schematic diagram of an equivalent circuit of a pixel drive circuit. As shown in FIG. 4, the pixel drive circuit may include seven transistors (a first transistor T1 to a seventh transistor T7), one storage capacitor C, and seven signal lines (a data signal line D, a first scan signal line S1, a second scan signal line S2, a light emitting signal line E, an initial signal line INIT, a first power supply line VDD, and a second power supply line VSS).

In an exemplary implementation mode, the pixel drive circuit may include a first node N1, a second node N2, and a third node N3. Herein, the first node N1 is respectively connected with a first electrode of the third transistor T3, a second electrode of the fourth transistor T4, and a second electrode of the fifth transistor T5, the second node N2 is respectively connected with a second electrode of the first transistor, a first electrode of the second transistor T2, a control electrode of the third transistor T3, and a second terminal of the storage capacitor C, and the third node N3 is respectively connected with a second electrode of the second transistor T2, a second electrode of the third transistor T3, and a first electrode of the sixth transistor T6.

In an exemplary implementation mode, a first terminal of the storage capacitor C is connected with the first power supply line VDD, and the second terminal of the storage capacitor C is connected with the second node N2, i.e., the second terminal of the storage capacitor C is connected with the control electrode of the third transistor T3.

A control electrode of the first transistor T1 is connected with the second scan signal line S2, a first electrode of the first transistor T1 is connected with the initial signal line INIT, and the second electrode of the first transistor is connected with the second node N2. When a scan signal with an on-level is applied to the second scan signal line S2, the first transistor T1 transmits an initialization voltage to the control electrode of the third transistor T3 so as to initialize a charge amount of the control electrode of the third transistor T3.

A control electrode of the second transistor T2 is connected with the first scan signal line S1, the first electrode of the second transistor T2 is connected with the second node N2, and the second electrode of the second transistor T2 is connected with the third node N3. When a scan signal with an on-level is applied to the first scan signal line S1, the second transistor T2 enables the control electrode of the third transistor T3 to be connected with the second electrode.

The control electrode of the third transistor T3 is connected with the second node N2, i.e., the control electrode of the third transistor T3 is connected with the second terminal of the storage capacitor C, the first electrode of the third transistor T3 is connected with the first node N1, and the second electrode of the third transistor T3 is connected with the third node N3. The third transistor T3 may be referred to as a drive transistor, and the third transistor T3 determines an amount of a drive current flowing between the first power supply line VDD and the second power supply line VSS according to a potential difference between the control electrode and the first electrode of the third transistor T3.

A control electrode of the fourth transistor T4 is connected with the first scan signal line S1, a first electrode of the fourth transistor T4 is connected with the data signal line D, and the second electrode of the fourth transistor T4 is connected with the first node N1. The fourth transistor T4 may be referred to as a switching transistor, a scan transistor, etc., and when a scan signal with an on-level is applied to the first scan signal line S1, the fourth transistor T4 enables a data voltage of the data signal line D to be input to the pixel drive circuit.

A control electrode of the fifth transistor T5 is connected with the light emitting signal line E, a first electrode of the fifth transistor T5 is connected with the first power supply line VDD, and the second electrode of the fifth transistor T5 is connected with the first node N1. A control electrode of the sixth transistor T6 is connected with the light emitting signal line E, the first electrode of the sixth transistor T6 is connected with the third node N3, and a second electrode of the sixth transistor T6 is connected with a first electrode of a light emitting device. The fifth transistor T5 and the sixth transistor T6 may be referred to as light emitting transistors.

When a light emitting signal with an on-level is applied to the light emitting signal line E, the fifth transistor T5 and the sixth transistor T6 enable the light emitting device to emit light by forming a drive current path between the first power supply line VDD and the second power supply line VSS.

A control electrode of the seventh transistor T7 is connected with the first scan signal line S1, a first electrode of the seventh transistor T7 is connected with the initial signal line INIT, and a second electrode of the seventh transistor T7 is connected with the first electrode of the light emitting device. When a scan signal with an on-level is applied to the first scan signal line S1, the seventh transistor T7 transmits an initialization voltage to the first electrode of the light emitting device so as to initialize a charge amount accumulated in the first electrode of the light emitting device or release a charge amount accumulated in the first electrode of the light emitting device.

In an exemplary implementation mode, a second electrode of the light emitting device is connected with the second power supply line VSS, a signal of the second power supply line VSS is a low-level signal, and a signal of the first power supply line VDD is a high-level signal continuously provided. The first scan signal line S1 is a scan signal line in a pixel drive circuit of a present display row, and the second scan signal line S2 is a scan signal line in a pixel drive circuit of a previous display row. That is, for an n-th display row, a first scan signal line S1 is S(n), and a second scan signal line S2 is S(n−1). A second scan signal line S2 of the present display row and a first scan signal line S1 in the pixel drive circuit of the previous display row are a same signal line, thus signal lines of a display panel may be reduced, so that a narrow bezel of the display panel is achieved.

In an exemplary implementation mode, the first transistor T1 to the seventh transistor T7 may be P-type transistors, or may be N-type transistors. Use of a same type of transistors in a pixel drive circuit may simplify a process flow, reduce process difficulties of the display panel, and improve a product yield. In some possible implementation modes, the first transistor T1 to the seventh transistor T7 may include a P-type transistor and an N-type transistor.

In an exemplary implementation mode, the first scan signal line S1, the second scan signal line S2, the light emitting signal line E, and the initial signal line INIT extend along a horizontal direction, and the second power supply line VSS, the first power supply line VDD, and the data signal line D extend along a vertical direction.

In an exemplary implementation mode, the light emitting device may be an Organic Light Emitting Diode (OLED), including a first electrode (anode), an organic emitting layer, and a second electrode (cathode) that are stacked.

Figure 5:
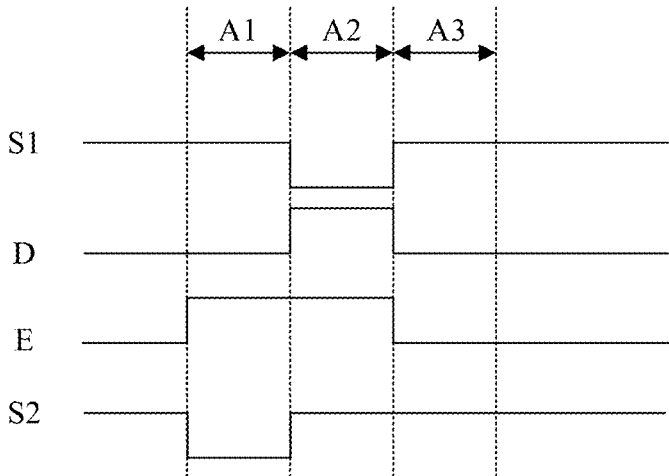
FIG. 5 is a working timing diagram of a pixel drive circuit.

FIG. 5 is a working timing diagram of a pixel drive circuit. An exemplary embodiment of the present disclosure will be described below through a working process of the pixel drive circuit shown in FIG. 4. The pixel drive circuit in FIG. 4 includes seven transistors (a first transistor T1 to a seventh transistor T7), one storage capacitor C, and seven signal lines (a data signal line D, a first scan signal line S1, a second scan signal line S2, a light emitting signal line E, an initial signal line INIT, a first power supply line VDD, and a second power supply line VSS), and all of the seven transistors are P-type transistors.

In an exemplary implementation mode, the working process of the pixel drive circuit may include following stages.

In a first stage A1, referred to as a reset stage, a signal of the second scan signal line S2 is a low-level signal, and signals of the first scan signal line S1 and the light emitting signal line E are high-level signals. The signal of the second scan signal line S2 is the low-level signal, so that the first transistor T1 is turned on, and a signal of the initial signal line INIT is provided to a second node N2 to initialize the storage capacitor C to clear an original data voltage in the storage capacitor. The signals of the first scan signal line S1 and the light emitting signal line E are the high-level signals, so that the second transistor T2, the fourth transistor T4, the fifth transistor T5, the sixth transistor T6, and the seventh transistor T7 are turned off. An OLED does not emit light in this stage.

In a second stage A2, referred to as a data writing stage or a threshold compensation stage, a signal of the first scan signal line S1 is a low-level signal, signals of the second scan signal line S2 and the light emitting signal line E are high-level signals, and the data signal line D outputs a data voltage. In this stage, a second terminal of the storage capacitor C is at a low level, so the third transistor T3 is turned on. The signal of the first scan signal line S1 is the low-level signal, so that the second transistor T2, the fourth transistor T4, and the seventh transistor T7 are turned on. The second transistor T2 and the fourth transistor T4 are turned on, so that the data voltage output by the data signal line D is provided to the second node N2 through a first node N1, the turned-on third transistor T3, a third node N3, and the turned-on second transistor T2, and the storage capacitor C is charged with a difference between the data voltage output by the data signal line D and a threshold voltage of the third transistor T3. A voltage at the second terminal (the second node N2) of the storage capacitor C is Vd−|Vth|, wherein Vd is the data voltage output by the data signal line D, and Vth is the threshold voltage of the third transistor T3. The seventh transistor T7 is turned on, so that an initialization voltage of the initial signal line INIT is provided to a first electrode of the OLED to initialize (reset) the first electrode of the OLED and clear a pre-stored voltage therein, thereby completing initialization to ensure that the OLED does not emit light. A signal of the second scan signal line S2 is a high-level signal, so that the first transistor T1 is turned off. A signal of the light emitting signal line E is a high-level signal, so that the fifth transistor T5 and the sixth transistor T6 are turned off.

In a third stage A3, referred to as a light emitting stage, a signal of the light emitting signal line E is a low-level signal, and signals of the first scan signal line S1 and the second scan signal line S2 are high-level signals. The signal of the light emitting signal line E is the low-level signal, so that the fifth transistor T5 and the sixth transistor T6 are turned on, and a power voltage output by the first power supply line VDD provides a drive voltage to the first electrode of the OLED through the turned-on fifth transistor T5, the third transistor T3, and the sixth transistor T6 to drive the OLED to emit light.

In a drive process of the pixel drive circuit, a drive current flowing through the third transistor T3 (drive transistor) is determined by a voltage difference between a gate electrode and a first electrode of the third transistor T3. The voltage of the second node N2 is Vdata−|Vth|, so the drive current of the third transistor T3 is as follows.

$$I=K*(Vgs-Vth)^2=K*[(Vdd-Vd+|Vth|)-Vth]^2=K*[(Vdd-Vd]^2$$

Herein, I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power supply line VDD.

Currently, a film formation method of an organic emitting layer in a light emitting structure layer mainly includes an evaporation process or a solution process. The evaporation process is relatively mature and has been applied to mass production of small-sized OLEDs, however, due to a high production cost and a large process difficulty of the evaporation process, the solution process is usually adopted for large-sized OLEDs. The solution process mainly includes inkjet printing, nozzle coating, spin coating, and screen printing, etc. Among them, since an inkjet printing process has advantages of high production efficiency, a low material cost, and achieving a large size, etc., it is considered as an important way to achieve mass production of large-sized OLEDs. The inkjet printing process is to print ink of an organic light emitting material into a pixel opening defined by a pixel definition layer, and then dry and cure the ink to form an organic emitting layer. In this process, due to an influence of a coffee ring effect, a problem of climbing-slope often occurs within the pixel opening in printing the ink, which eventually affects homogeneity of film formation of the organic emitting layer, reduces display uniformity, and lowers display quality of an OLED product.

An exemplary embodiment of the present disclosure provides a display substrate including a base substrate and a pixel definition layer disposed on the base substrate; the pixel definition layer includes a plurality of first pixel definition structures, a plurality of second pixel definition structures, and a plurality of third pixel definition structures; the first pixel definition structures have a long strip shape extending along a first direction, the plurality of first pixel definition structures are arranged sequentially along a second direction, the first direction and the second direction are intersected; the second pixel definition structures have a long strip shape extending along the second direction, the plurality of second pixel definition structures are disposed at intervals between adjacent first pixel definition structures; at least one third pixel definition structure is disposed between a first pixel definition structure and a second pixel definition structure; a height of a third pixel definition structure may be less than a height of a second pixel definition structure in a direction perpendicular to the base substrate.

In an exemplary implementation mode, at least one third pixel definition structure and the first pixel definition structure and the second pixel definition structure form an ink channel for ink to flow in the first direction.

In an exemplary implementation mode, the first pixel definition structure may be configured to store ink forming an organic emitting layer, the second pixel definition structure may be configured to define an open region of a sub-pixel, and the third pixel definition structure may be configured to guide flow in an edge region of the first pixel definition structure to reduce a thickness of the organic emitting layer in the edge region of the first pixel definition structure, and reduce brightness of the edge region of the first pixel definition structure.

In an exemplary implementation mode, a height of the second pixel definition structure may be less than a height of the first pixel definition structure in a direction perpendicular to the base substrate.

In an exemplary implementation mode, there is a first distance between a side face of the first pixel definition structure close to the second pixel definition structure and an end face of the second pixel definition structure close to the first pixel definition structure, and the first distance may be greater than or equal to 2 μm.

In an exemplary implementation mode, there may be a first overlap region between an orthographic projection of the first pixel definition structure on the base substrate and an orthographic projection of the third pixel definition structure on the base substrate, and a first overlap width of the first overlap region may be about 1 μm to 3 μm in the second direction.

In an exemplary implementation mode, there may be a second overlap region between an orthographic projection of the second pixel definition structure on the base substrate and an orthographic projection of the third pixel definition structure on the base substrate, and a second overlap width of the second overlap region may be about 1 μm to 3 μm in the second direction.

In an exemplary implementation mode, the first pixel definition structure and the third pixel definition structure may be interconnected to be of an integral structure and formed simultaneously using a same patterning process.

In an exemplary implementation mode, the second pixel definition structure and the third pixel definition structure may be interconnected to be of an integral structure and formed simultaneously using a same patterning process.

In an exemplary implementation mode, the second pixel definition structure and the third pixel definition structure may be formed simultaneously using a same patterning process.

In an exemplary implementation mode, the third pixel definition structure may include at least two mutually isolated sub-definition structures, and the at least two sub-definition structures are sequentially arranged along the first direction.

In an exemplary implementation mode, an orthographic projection of at least one sub-definition structure on the base substrate may be at least partially overlapped with an orthographic projection of the first pixel definition structure on the base substrate, and/or, an orthographic projection of at least one sub-definition structure on the base substrate may be at least partially overlapped with an orthographic projection of the second pixel definition structure on the base substrate.

In an exemplary implementation mode, an orthographic projection of at least one sub-definition structure on the base substrate may be not overlapped with an orthographic projection of the first pixel definition structure on the base substrate, and/or an orthographic projection of at least one sub-definition structure on the base substrate may be not overlapped with an orthographic projection of the second pixel definition structure on the base substrate.

In an exemplary implementation mode, the display substrate may include an organic emitting layer, the organic emitting layer is disposed within an open region defined by the first pixel definition structure and the second pixel definition structure, and the organic emitting layer covers the third pixel definition structure.

Figure 6A:
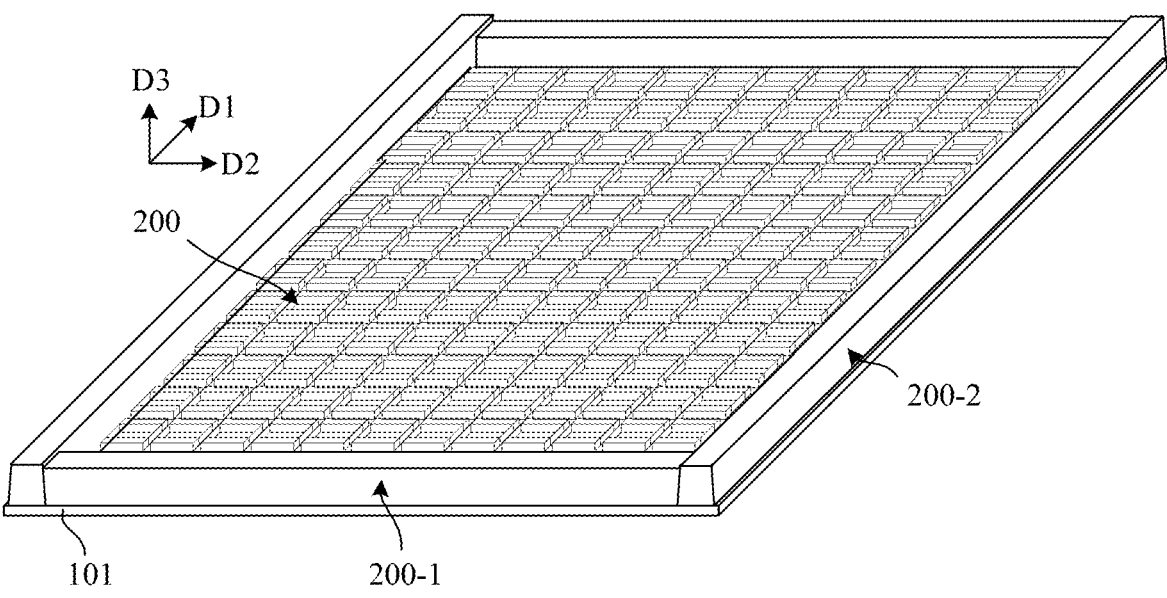
FIG. 6a, FIG. 6b, and FIG. 6c are schematic diagrams of a planar structure of a display substrate according to an exemplary embodiment of the present disclosure.
Figure 6B:
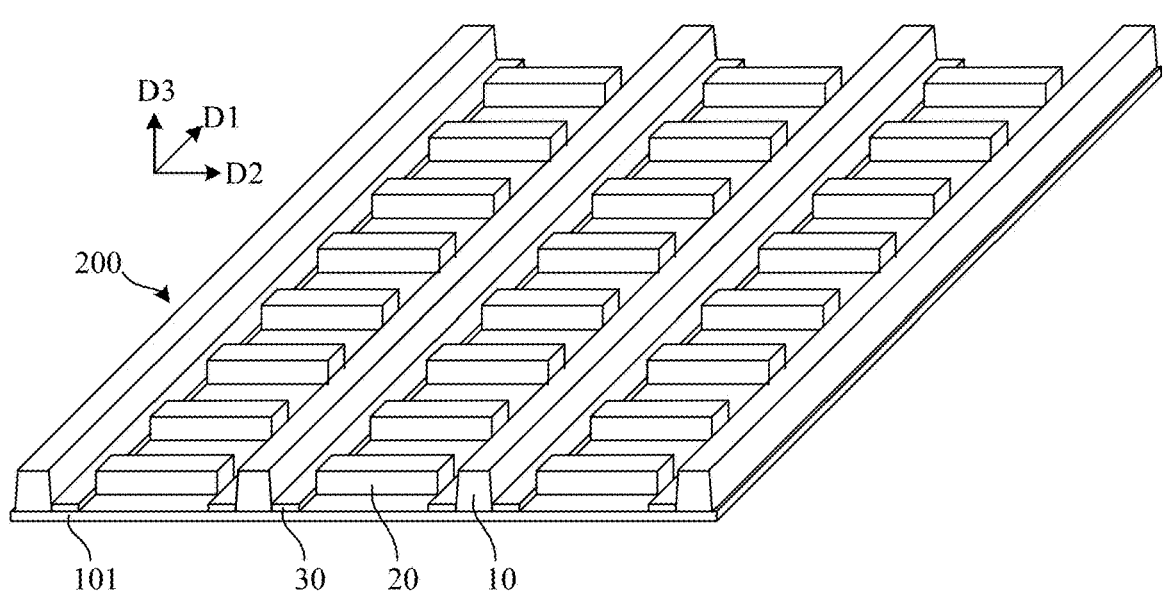
Figure 6C:
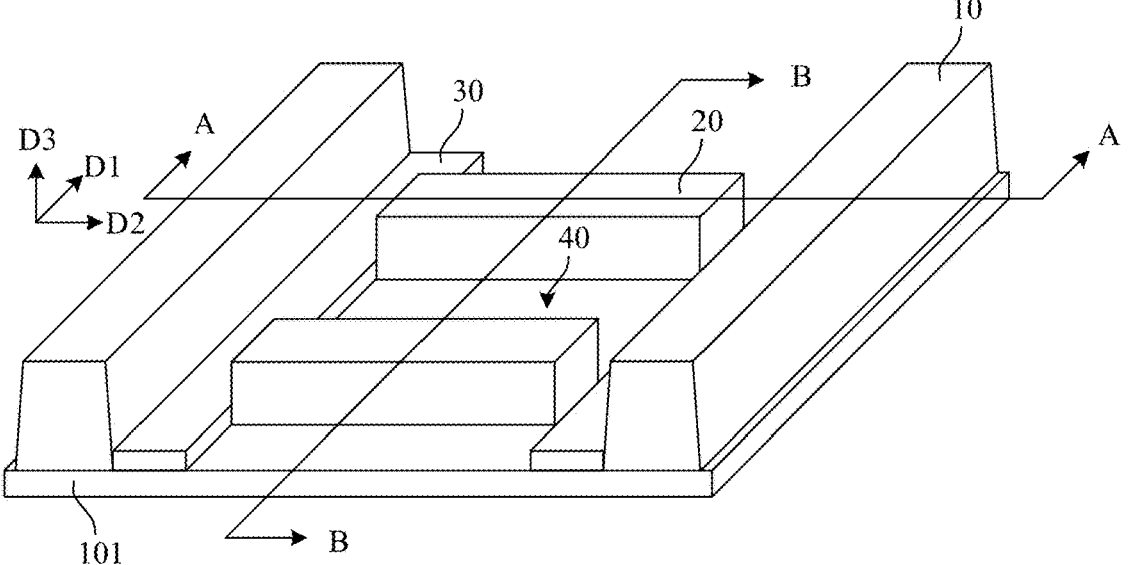

FIG. 6a, FIG. 6b, and FIG. 6c are schematic diagrams of a planar structure of a display substrate according to an exemplary embodiment of the present disclosure, FIG. 6a is a structure of a pixel definition layer on the display substrate, FIG. 6b is a structure of a pixel definition layer in partial sub-pixels in FIG. 6a, and FIG. 6c is a structure of a pixel definition layer in a sub-pixel in FIG. 6b. As shown in FIG. 6a, FIG. 6b, and FIG. 6c, the display substrate may include a base substrate 101 and a pixel definition layer 200 disposed on the base substrate 101, a first edge structure 200-1 is disposed at an edge of the pixel definition layer 200 in a first direction D1, a second edge structure 200-2 is disposed at an edge of the pixel definition layer 200 in a second direction D2, the first edge structure 200-1 may extend along the second direction D2, the second edge structure 200-2 may extend along the first direction D1, and the first edge structure 200-1 and the second edge structure 200-2 are connected sequentially to form a ring structure surrounding the pixel definition layer 200. Herein, the first direction D1 and the second direction D2 are intersected.

In an exemplary implementation mode, the pixel definition layer 200 may include a plurality of first pixel definition structures 10, a plurality of second pixel definition structures 20, and a plurality of third pixel definition structures 30. The first pixel definition structures 10 have a long strip shape extending along the first direction D1, and the plurality of first pixel definition structures 10 are arranged sequentially along the second direction D2. The second pixel definition structures 20 have a long strip shape extending along the second direction D2, and the plurality of second pixel definition structures 20 are sequentially arranged between adjacent first pixel definition structures 10 along the first direction D1. At least one third pixel definition structure 30 may be disposed on a side of a first pixel definition structure 10 in the second direction D2 and on a side of the first pixel definition structure 10 in an opposite direction of the second direction D2. Or, the at least one third pixel definition structure 30 may be disposed on a side of a second pixel definition structure 20 in the second direction D2 and on a side of the second pixel definition structure 20 in an opposite direction of the second direction D2.

In an exemplary implementation mode, a height of a third pixel definition structure 30 may be less than a height of a second pixel definition structure 20, the height of the second pixel definition structure 20 may be less than a height of a first pixel definition structure 10, and a height is a dimension in a direction perpendicular to the base substrate (a third direction D3) so that the first pixel definition structure 10, the second pixel definition structure 20, and the third pixel definition structure 30 together form an ink channel through which ink may flow in the first direction D1.

Figure 7:
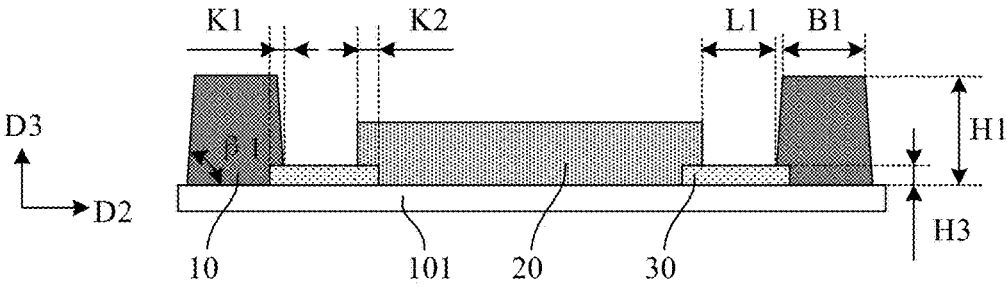
FIG. 7 is a cross-sectional view taken along an A-A direction in FIG. 6c.
Figure 8:
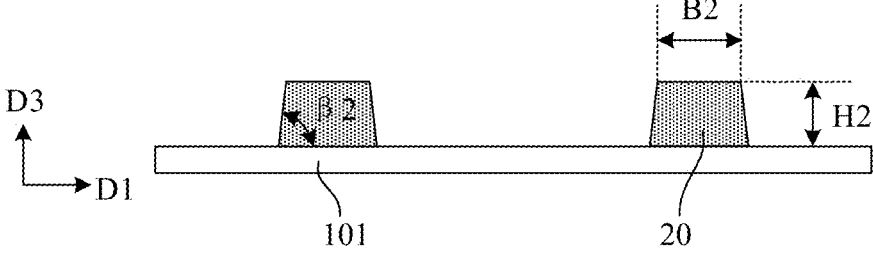
FIG. 8 is a cross-sectional view taken along a B-B direction in FIG. 6c.

FIG. 7 and FIG. 8 are a structure of a pixel definition layer according to an exemplary embodiment of the present disclosure, FIG. 7 is a cross-sectional view taken along an A-A direction in FIG. 6c and FIG. 8 is a cross-sectional view taken along a B-B direction in FIG. 6c. As shown in FIG. 6c, FIG. 7, and FIG. 8, a pixel definition layer in a sub-pixel may include a first pixel definition structure 10, a second pixel definition structure 20, and a third pixel definition structure 30, the first pixel definition structure 10 and the third pixel definition structure 30 extend along a first direction D1, the third pixel definition structure 30 is disposed on a side of the first pixel definition structure 10 in a second direction D2 and on a side of the first pixel definition structure 10 in an opposite direction of the second direction D2 respectively, and the second pixel definition structure 20 extends along the second direction D2 and is disposed between two adjacent first pixel definition structures 10 in the second direction D2.

In an exemplary implementation mode, a first pixel definition structure 10 and a second pixel definition structure 20 which are intersected form an open region of a sub-pixel, and the second pixel definition structure 20 and a third pixel definition structure 30 which are intersected form a light emitting region 40 of the sub-pixel. Herein, an open region of a sub-pixel is a region where an organic emitting layer is located in the sub-pixel, a light emitting region of a sub-pixel is a region where an organic emitting layer in the open region of the sub-pixel can emit light, i.e., a region where the organic emitting layer is in contact with an anode, an area of the light emitting region is less than an area of the open region, and an orthographic projection of the light emitting region on the base substrate is located within a range of an orthographic projection of the open region on the base substrate.

In an exemplary implementation mode, in the second direction D2, there is a first distance between an edge of the first pixel definition structure 10 on a side close to the second pixel definition structure 20 and an end face of the second pixel definition structure 20 close to the first pixel definition structure 10, and the first distance L1 may be used as a width of an ink channel in which ink flows in the first direction D1. In an exemplary implementation mode, the third pixel definition structure 30 extending along the first direction D1 is disposed at a bottom of the ink channel. In this way, the edge of the first pixel definition structure 10, an end of the second pixel definition structure 20, and a surface of the third pixel definition structure 30 on a side away from the base substrate together form an ink channel in which ink can flow in the first direction D1.

In an exemplary embodiment, the first distance L1 may be greater than or equal to 2 For example, the first distance L1 may be about 2 μm to 4 μm, so that the ink has good fluidity in the ink channel.

In an exemplary implementation mode, the third pixel definition structure 30 may be at least partially overlapped with the first pixel definition structure 10, the first pixel definition structure 10 is lapped joint and disposed at an edge of the third pixel definition structure 30 on a side close to the first pixel definition structure 10, and there is a first overlap region between an orthographic projection of the third pixel definition structure 30 on the base substrate and an orthographic projection of the first pixel definition structure 10 on the base substrate.

In an exemplary implementation mode, the third pixel definition structure 30 may be at least partially overlapped with the second pixel definition structure 20, the second pixel definition structure 20 is lapped joint and disposed at an edge of the third pixel definition structure 30 on a side away from the first pixel definition structure 10 and there is a second overlap region between an orthographic projection of the third pixel definition structure 30 on the base substrate and an orthographic projection of the second pixel definition structure 20 on the base substrate.

In an exemplary implementation mode, a first overlap width K1 of the first overlap region may be about 1 μm to 3 μm, a second overlap width K2 of the second overlap region may be about 1 μm to 3 μm, and the first overlap width and the second overlap width are dimensions in the second direction D2.

In an exemplary implementation mode, in a plane perpendicular to an extension direction of the first pixel definition structure 10, i.e., in a plane perpendicular to the first direction D1, a cross-sectional shape of the first pixel definition structure 10 may be a first trapezoid, the first trapezoid has a first lower bottom close to the base substrate, a first upper bottom away from the base substrate, and two first side edges connecting the first lower bottom and the first upper bottom, respectively.

In an exemplary implementation mode, a first width B1 of the first upper bottom may be greater than or equal to 15 μm, a first slope angle β1 of a first side edge may be about 30° to 70°, and the first width is a dimension in the second direction D2.

In an exemplary implementation mode, a first height H1 of the first pixel definition structure 10 may be about 1.0 μm to 2.0 μm, and the first height is a dimension in a third direction D3 (a direction perpendicular to the base substrate).

In an exemplary implementation mode, in a plane perpendicular to an extension direction of the second pixel definition structure 20, i.e., in a plane perpendicular to the second direction D2, a cross-sectional shape of the second pixel definition structure 20 may be a second trapezoid, the second trapezoid has a second lower bottom close to the base substrate, a second upper bottom away from the base substrate, and two second side edges connecting the second lower bottom and the second upper bottom, respectively.

In an exemplary implementation mode, a second width K2 of the second upper bottom may be greater than or equal to 3 μm, a second slope angle β2 of a second side edge may be about 30° to 90°, and the second width is a dimension in the first direction D1.

In an exemplary implementation mode, a second height H2 of the second pixel definition structure 20 may be about 0.3 μm to 0.8 μm, and the second height is a dimension in the third direction D3 (a direction perpendicular to the base substrate).

In an exemplary implementation mode, in a plane perpendicular to an extension direction of the third pixel definition structure 30, i.e., in a plane perpendicular to the first direction D1, a cross-sectional shape of the third pixel definition structure 30 may be a rectangle or a trapezoid.

In an exemplary implementation mode, a third height H3 of the third pixel definition structure 30 may be about 0.1 μm to 0.3 μm, and the third height is a dimension in the third direction D3 (a direction perpendicular to the base substrate).

In an exemplary implementation mode, in the second direction D2, a distance between adjacent first pixel definition structures 10 may be determined based on factors such as a pixel size and a minimum diameter of an ink droplet, and the distance between adjacent first pixel definition structures 10 is greater than the minimum diameter of the ink droplet. For example, the distance between adjacent first pixel definition structures 10 may be greater than or equal to 12 In the first direction D1, a distance between adjacent second pixel definition structures 20 may be determined based on factors such as a pixel size, which is not limited in the present disclosure.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and inkjet printing. Etching may be any one or more of dry etching and wet etching, which is not limited in the present disclosure. A "thin film" refers to a layer of thin film made of a material on a base substrate using deposition, coating, or another process. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B being disposed on a same layer" mentioned in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B is within a range of an orthographic projection of A" or "an orthographic projection of A includes an orthographic projection of B" refers to that a boundary of the orthographic projection of B falls within a range of a boundary of the orthographic projection of A, or a boundary of the orthographic projection of A is overlapped with a boundary of the orthographic projection of B.

In an exemplary implementation mode, the preparation process of the display substrate according to the exemplary embodiment may include following operations.

(11) Forming a pattern of a base substrate. In an exemplary embodiment, the base substrate may be a rigid base substrate, or a flexible base substrate. The rigid base substrate may be glass or quartz, and the flexible base substrate may be of a single-layer structure or a laminated structure.

In an exemplary embodiment, the flexible base substrate may include a first flexible material layer, a first inorganic layer, a second flexible material layer, and a second inorganic layer stacked on a glass carrier plate. In an exemplary implementation mode, materials of the first flexible layer and the second flexible layer may be Polyimide (PI), Polyethylene Terephthalate (PET), or surface-treated polymer soft film, etc. Materials of the first inorganic layer and the second inorganic layer may be Silicon Nitride (SiNx) or Silicon Oxide (SiOx), etc. The first inorganic layer and the second inorganic layer may be referred to as barrier layers or buffer layers.

(12) Forming a pattern of a drive circuit layer on the base substrate. In an exemplary implementation mode, the drive circuit layer may include a transistor and a storage capacitor constituting a pixel drive circuit. In an exemplary implementation mode, forming the pattern of the drive circuit layer may include following operations.

A semiconductor thin film is deposited on the base substrate, the semiconductor thin film is patterned through a patterning process, a pattern of a semiconductor layer is formed on the base substrate, and the pattern of the semiconductor layer at least includes an active layer.

Subsequently, a first insulation thin film and a first metal thin film are sequentially deposited, and the first metal thin film is patterned through a patterning process to form a first insulation layer covering the pattern of the semiconductor layer and a pattern of a first metal layer disposed on the first insulation layer. The pattern of the first metal layer includes at least a gate electrode and a first capacitor electrode.

Subsequently, a second insulation thin film and a second metal thin film are sequentially deposited, and the second metal thin film is patterned through a patterning process to form a second insulation layer covering the pattern of the first metal layer and a pattern of a second metal layer disposed on the second insulation layer. The pattern of the second metal layer includes at least a second capacitor electrode, and a position of the second capacitor electrode corresponds to a position of the first capacitor electrode.

Subsequently, a third insulation thin film is deposited, the third insulation thin film is patterned through a patterning process to form a third insulation layer covering the pattern of the second metal layer, and at least one active via is formed on the third insulation layer. The third insulation layer, the second insulation layer, and the first insulation layer within the active via are etched away to expose a surface of the active layer.

Subsequently, a third metal thin film is deposited, and the third metal thin film is patterned through a patterning process to form a pattern of a third metal layer on the third insulation layer. The pattern of the third metal layer includes at least a source electrode and a drain electrode, and the source electrode and the drain electrode are connected with the active layer through the active via, respectively.

Subsequently, a planarization thin film is deposited, the planarization thin film is patterned through a patterning process to form a planarization layer covering the pattern of the third metal layer, at least one pattern of an anode via is provided on the planarization layer, and the anode via exposes a surface of the drain electrode.

Figure 9:
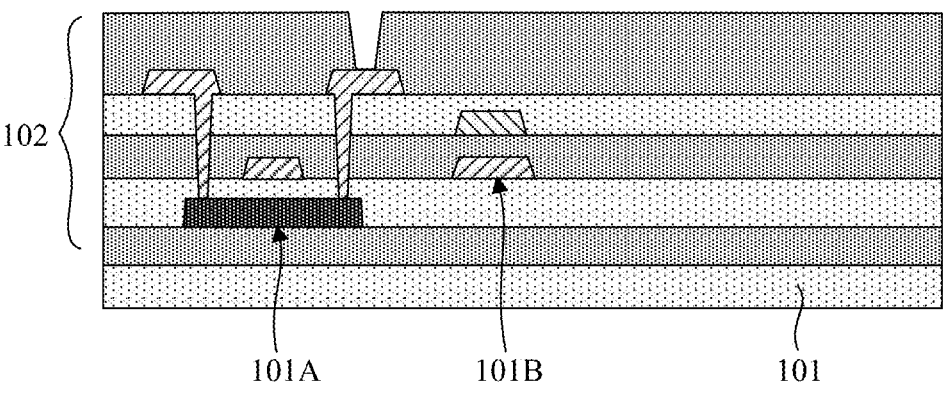
FIG. 9 is a schematic diagram after a pattern of a drive circuit layer is formed according to an exemplary embodiment of the present disclosure.

So far, preparation of the pattern of the drive circuit layer 102 disposed on the base substrate 101 is completed, as shown in FIG. 9, which illustrates a structure of a sub-pixel of the display substrate, and a pixel drive circuit in the sub-pixel is exemplified by a transistor 101A and a storage capacitor 101B. In an exemplary implementation mode, the active layer, the gate electrode, the source electrode, and the drain electrode constitute the transistor 101A, and the first capacitor electrode and the second capacitor electrode constitute the storage capacitor 101B. In an exemplary implementation mode, a transistor may be a drive transistor in the pixel drive circuit.

In an exemplary implementation mode, the first insulation layer, the second insulation layer, and the third insulation layer may be made of any one or more of Silicon Oxide (SiOx), Silicon Nitride (SiNx), and Silicon OxyNitride (SiON), and may be a single layer, a multi-layer, or a composite layer. The first insulation layer and the second insulation layer are referred to as Gate Insulator (GI) layers, and the third insulation layer is referred to as an Interlayer Dielectric (ILD) layer. The planarization thin film may be made of an organic material, such as a polysiloxane series material, an acrylic series material, a polyimide series material, or resin. The first metal thin film, the second metal thin film, and the third metal thin film may be made of a metal material, such as any one or more of Argentum (Ag), Copper (Cu), Aluminum (Al), Titanium (Ti), and Molybdenum (Mo), or an alloy material of the above metals, such as an Aluminum-Neodymium alloy (AlNd) or a Molybdenum-Niobium alloy (MoNb), and may be of a single-layer structure or a multi-layer composite structure, such as Ti/Al/Ti. An active layer thin film may be made of an amorphous Indium Gallium Zinc Oxide (a-IGZO), Zinc OxyNitride (ZnON), Indium Zinc Tin Oxide (IZTO), amorphous Silicon (a-Si), polycrystalline Silicon (p-Si), hexathiophene, polythiophene, and other materials, that is, the present disclosure is applicable to transistors manufactured based on an oxide technology, a silicon technology, and an organic matter technology.

In an exemplary implementation mode, the drive circuit layer 102 may include a fourth insulation layer, which may cover the pattern of the third metal layer, the planarization layer is disposed on the fourth insulation layer, and the fourth insulation layer is referred to as a Passivation (PVX) layer.

Figure 10:
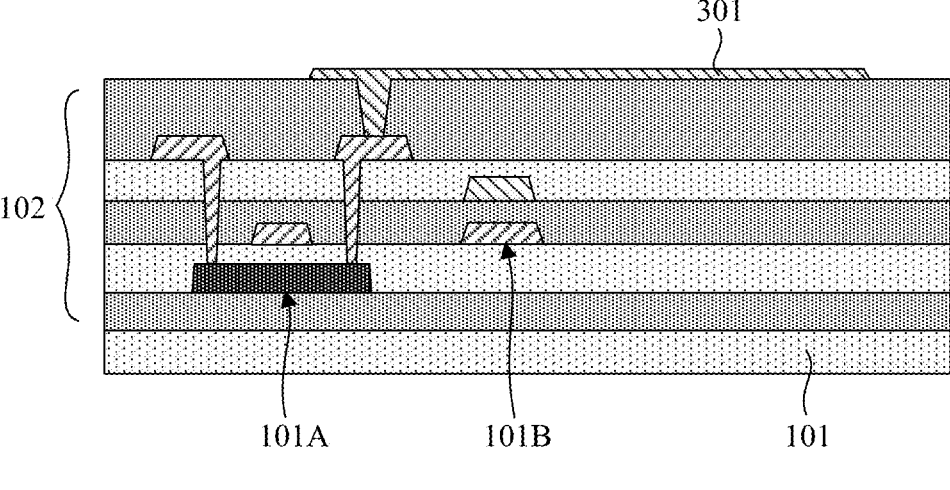
FIG. 10 is a schematic diagram after a pattern of an anode is formed according to an exemplary embodiment of the present disclosure.

(13) Forming a pattern of an anode. In an exemplary implementation mode, forming the pattern of the anode may include: depositing a conductive thin film on the base substrate on which the aforementioned patterns are formed, and patterning the conductive thin film through a patterning process to form a pattern of an anode 301, wherein the anode 301 is connected with a drain electrode of a transistor through the anode via, as shown in FIG. 10.

In an exemplary implementation mode, in a plane parallel to the base substrate, a shape of the anode 301 may be any one or more of following: a square, a rectangle, a pentagon, a hexagon, a circle, and an ellipse.

In an exemplary implementation mode, the conductive thin film may be made of a metal material or a transparent conductive material, and the metal material may include any one or more of Argentum (Ag), Copper (Cu), Aluminum (Al), Titanium (Ti), and Molybdenum (Mo), or an alloy material of the above metals, and the transparent conductive material may include Indium Tin Oxide (ITO) or Indium Zinc Oxide (IZO). In an exemplary implementation mode, the conductive thin film may have a single-layer structure or a multi-layer composite structure, such as ITO/Al/ITO.

Figure 11A:
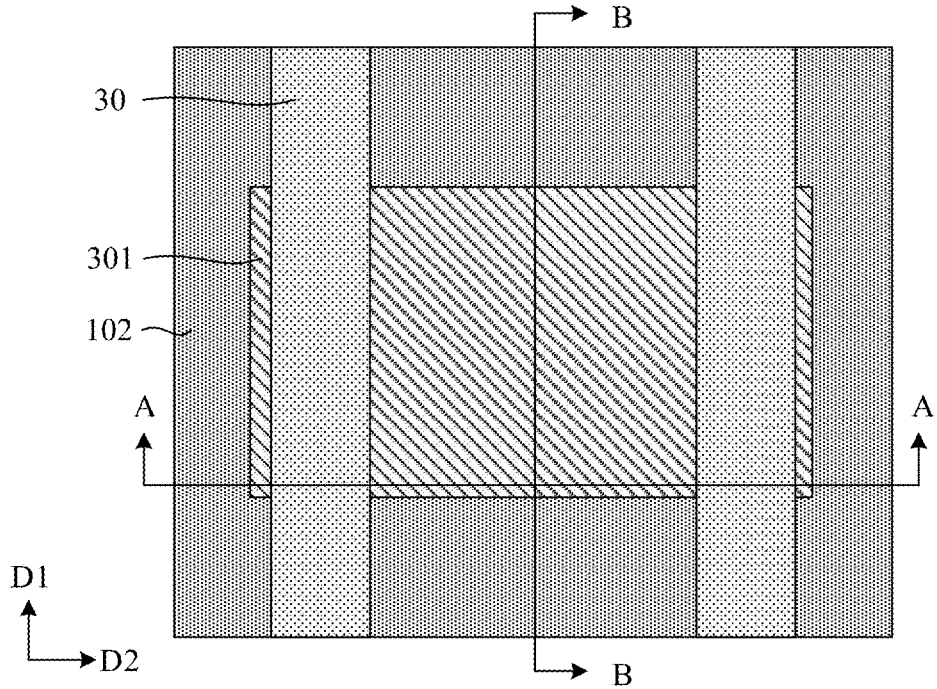
FIG. 11a, FIG. 11b, and FIG. 11c are schematic diagrams after a pattern of a third pixel definition layer is formed according to the present disclosure.
Figure 11B:
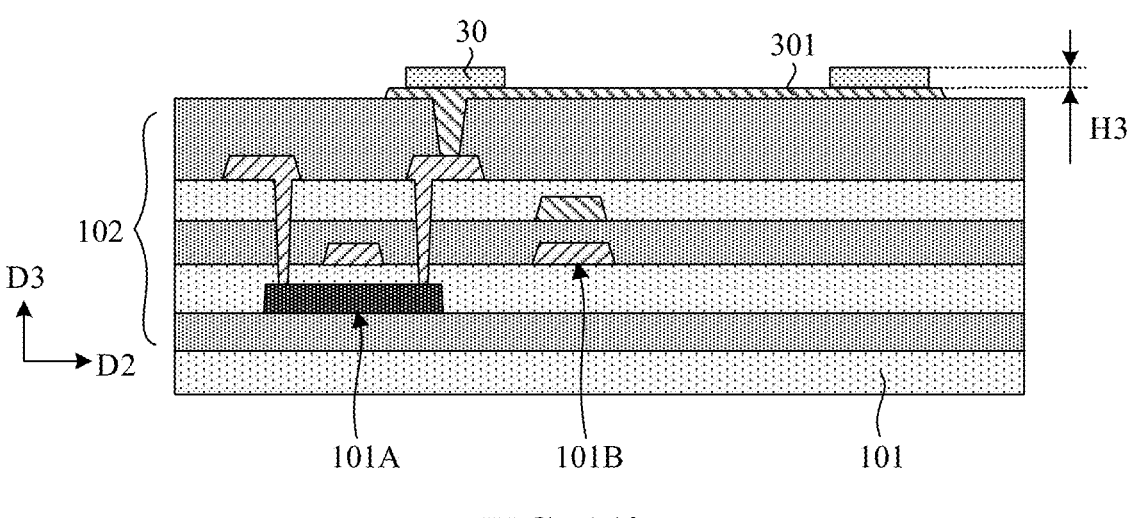
Figure 11C:
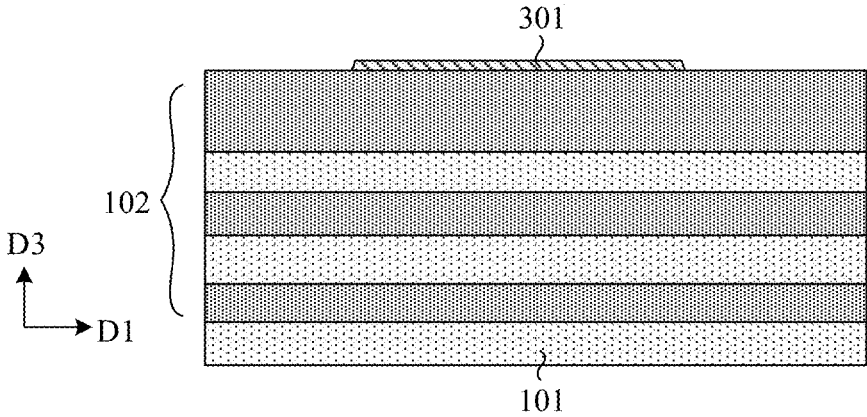

(14) Forming a pattern of a third pixel definition layer. In an exemplary implementation mode, forming the pattern of the third pixel definition layer may include: depositing or coating a third pixel definition thin film on the base substrate on which the aforementioned patterns are formed, patterning the third pixel definition thin film through a patterning process to form the pattern of the third pixel definition layer, as shown in FIG. 11a, FIG. 11b, and FIG. 11c. FIG. 11a is a schematic plan view of a sub-pixel in the display substrate, FIG. 11b is a cross-sectional view taken along an A-A direction in FIG. 11a, and FIG. 11c is a cross-sectional view taken along a B-B direction in FIG. 11a.

In an exemplary implementation mode, the pattern of the third pixel definition layer may include at least two third pixel definition structures 30. The two third pixel definition structures 30 have a long strip shape extending along a first direction D1. The two third pixel definition structures 30 are respectively disposed on both sides of the anode 301 in a second direction D2. An orthographic projection of a third pixel definition structure 30 on the base substrate is at least partially overlapped with an orthographic projection of the anode 301 on the base substrate.

In an exemplary implementation mode, in a plane perpendicular to the first direction D1 (i.e., a D2-D3 plane), a cross-sectional shape of the third pixel definition structure 30 may be a rectangle or a trapezoid. In an exemplary implementation mode, a cross-sectional shape of the third pixel definition structure 30 may be another regular shape, which is not limited in the present disclosure.

In an exemplary implementation mode, a third height H3 of the third pixel definition structure 30 may be about 0.1 μm to 0.3 μm.

In an exemplary implementation mode, the third pixel definition film may be coated using a nanoimprinting process, and then the pattern of the third pixel definition layer is formed through a patterning process.

In an exemplary implementation mode, an orthographic projection of the anode via in the driver circuit layer 102 on the base substrate may be located within a range of an orthographic projection of the third pixel definition structure 30 on the base substrate, so that a region where the anode via is located is covered by the third pixel definition structure 30, which may ensure flatness of the anode.

Figure 12A:
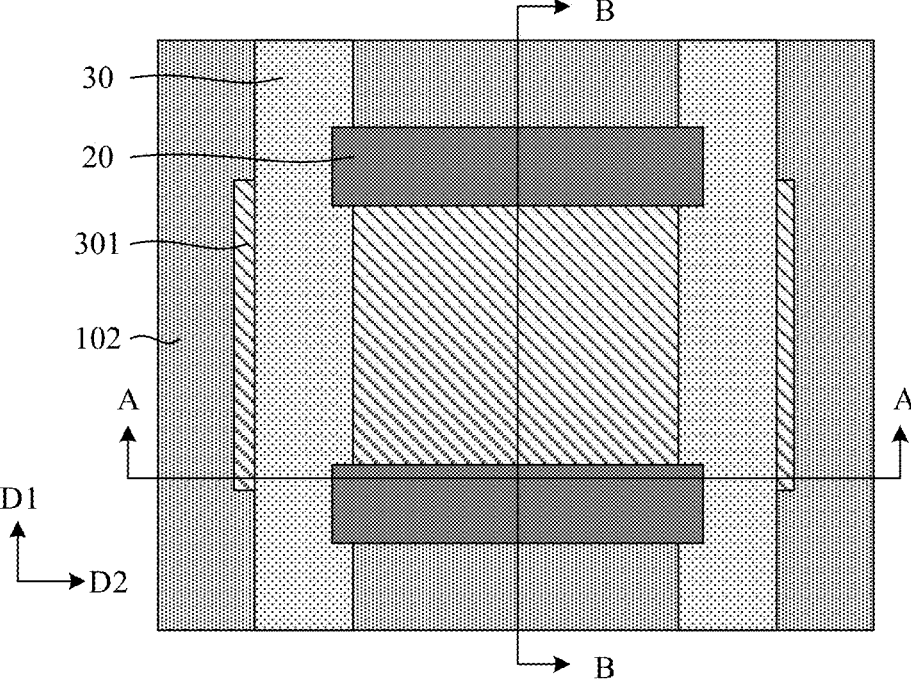
FIG. 12a, FIG. 12b, and FIG. 12c are schematic diagrams after a pattern of a second pixel definition layer is formed according to the present disclosure.
Figures 12B, 12C:
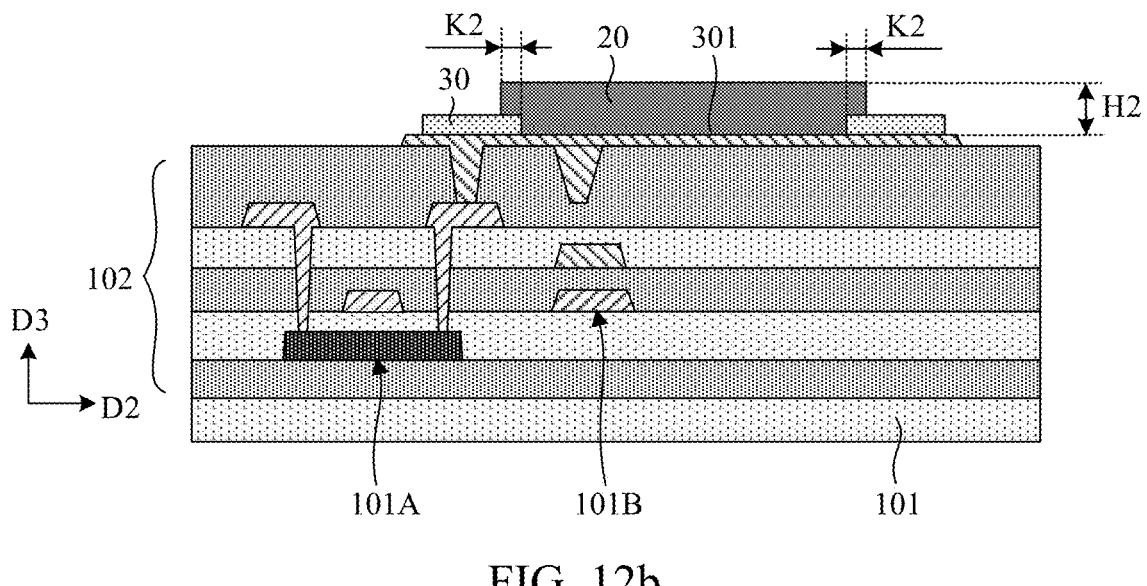

(15) Forming a pattern of a second pixel definition layer. In an exemplary implementation mode, forming the pattern of the second pixel definition layer may include: coating a second pixel definition thin film on the base substrate on which the aforementioned patterns are formed, patterning the second pixel definition thin film through a patterning process to form the pattern of the second pixel definition layer, as shown in FIG. 12a, FIG. 12b, and FIG. 12c. FIG.

12b is a cross-sectional view taken along an A-A direction in FIG. 12a, and FIG. 12c is a cross-sectional view taken along a B-B direction in FIG. 12a.

In an exemplary implementation mode, the pattern of the second pixel definition layer may include at least two second pixel definition structures 20. The two second pixel definition structures 20 have a long strip shape extending along the second direction D2. The two second pixel definition structures 20 are respectively disposed on both sides of the anode 301 in the first direction D1. An orthographic projection of a second pixel definition structure 20 on the base substrate is at least partially overlapped with an orthographic projection of the anode 301 on the base substrate.

In an exemplary implementation mode, in the second direction D2, two ends of the second pixel definition structure 20 are lapped joint and disposed on two third pixel definition structures 30 respectively, and there is a second overlap region between an orthographic projection of the second pixel definition structure 20 on the base substrate and an orthographic projection of a third pixel definition structure 30 on the base substrate.

In an exemplary implementation mode, a second overlap width K2 of the second overlap region may be about 1 μm to 3 μm in the second direction D2.

In an exemplary implementation mode, in a plane perpendicular to the second direction D2 (i.e., a D1-D3 plane), a cross-sectional shape of the second pixel definition structure 20 may be a second trapezoid in a shape of a trapezoid. The second trapezoid has a second lower bottom close to the base substrate, a second upper bottom away from the base substrate, and two second side edges connecting the second lower bottom and the second upper bottom respectively, a second slope angle β2 of a second side edge may be about 30° to 90°, and a second width B2 of the second upper bottom may be greater than or equal to 3 μm, so that the anode can be effectively wrapped.

In an exemplary implementation mode, a second height H2 of the second pixel definition structure 20 may be greater than a third height H3 of the third pixel definition structure 30.

In an exemplary implementation mode, the second height H2 of the second pixel definition structure 20 may be about 0.3 μm to 0.8 μm.

In an exemplary implementation mode, a distance between adjacent second pixel definition structures 20 may be determined based on factors such as a pixel size, which is not limited in the present disclosure.

In an exemplary implementation mode, an orthographic projection of the anode via in the drive circuit layer 102 on the base substrate may be located within a range of an orthographic projection of the second pixel definition structure 20 on the base substrate, so that a region where the anode via is located is covered by the second pixel definition structure 20, which may ensure flatness of the anode.

Figure 13A:
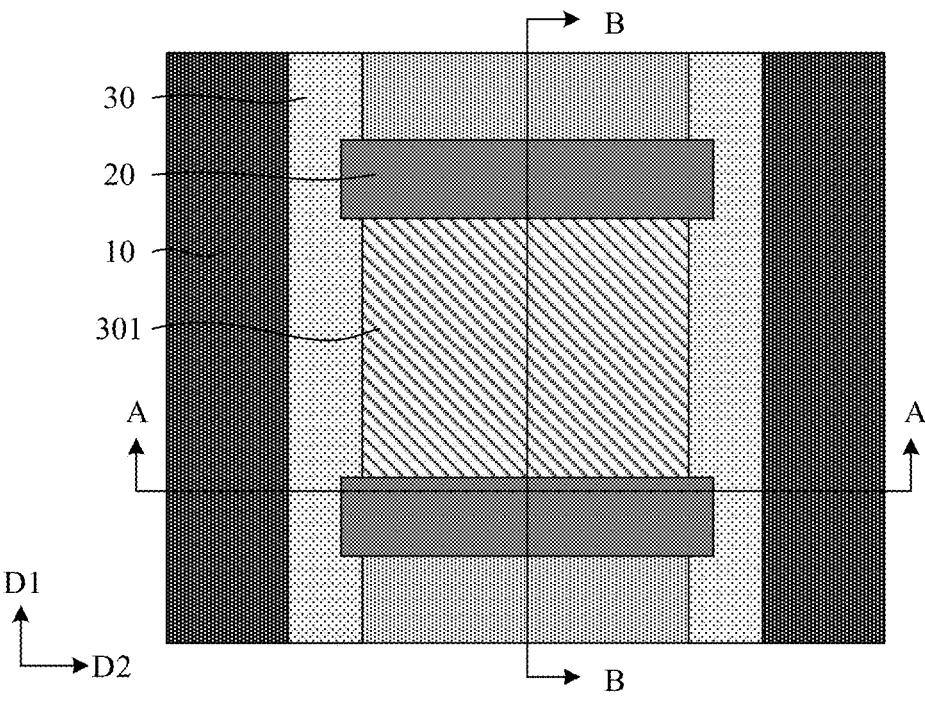
FIG. 13a, FIG. 13b, and FIG. 13c are schematic diagrams after a pattern of a first pixel definition layer is formed according to the present disclosure.
Figure 13B:
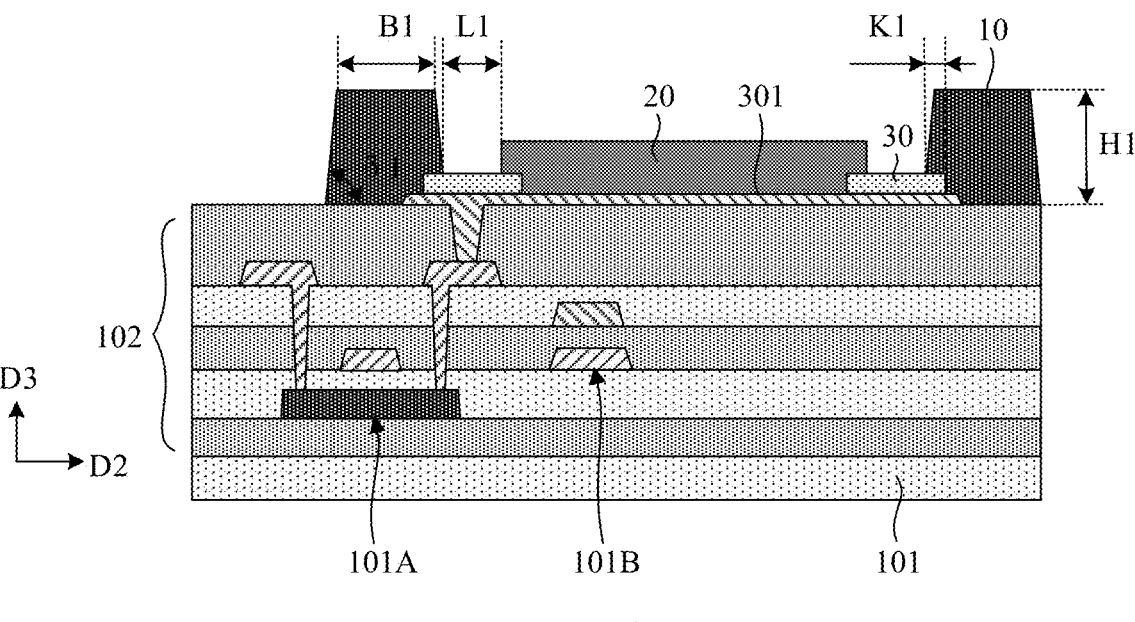
Figure 13C:
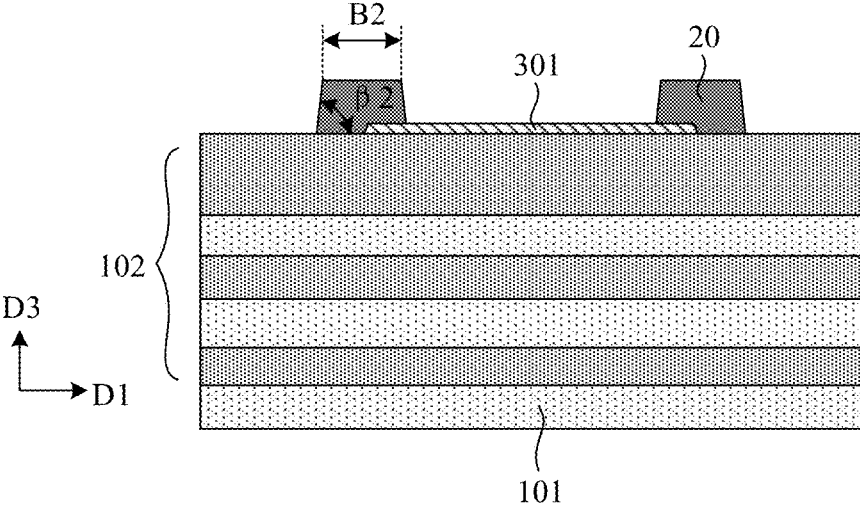

(16) Forming a pattern of a first pixel definition layer. In an exemplary implementation mode, forming the pattern of the first pixel definition layer may include: coating a first pixel definition thin film on the base substrate on which the aforementioned patterns are formed, patterning the first pixel definition thin film through a patterning process to form the pattern of the first pixel definition layer, as shown in FIG. 13a, FIG. 13b, and FIG. 13c. FIG. 13b is a cross-sectional view taken along an A-A direction in FIG. 13a and FIG. 13c is a cross-sectional view taken along a B-B direction in FIG. 13a.

In an exemplary implementation mode, the pattern of the first pixel definition layer may include at least two first pixel definition structures 10. The two first pixel definition structures 10 have a long strip shape extending along the first direction D1. The two first pixel definition structures 10 are respectively disposed on both sides of the anode 301 in the second direction D2. An orthographic projection of a first pixel definition structure 10 on the base substrate is at least partially overlapped with an orthographic projection of the anode 301 on the base substrate.

In an exemplary implementation mode, in the second direction D2, a side of the first pixel definition structure 10 close to the anode 301 is lapped joint and disposed on the third pixel definition structure 30, and there is a first overlap region between an orthographic projection of the first pixel definition structure 10 on the base substrate and an orthographic projection of the third pixel definition structure 30 on the base substrate.

In an exemplary implementation mode, a first overlap width K1 of the first overlap region may be about 1 μm to 3 μm in the second direction D2.

In an exemplary implementation mode, in the second direction D2, there is a first distance L1 between a first edge of the first pixel definition structure 10 on a side close to the first pixel definition structure 10 and a first end face of the second pixel definition structure 20 close to the first pixel definition structure 10, which forms an ink channel in which ink may flow in the first direction D1. In an exemplary implementation mode, the first distance L1 may be greater than or equal to 2 For example, the first distance L1 may be about 2 μm to 4 μm so that the ink has good fluidity in the ink channel.

In an exemplary implementation mode, in a plane perpendicular to the first direction D1 (i.e., a D2-D3 plane), a cross-sectional shape of the first pixel definition structure 10 may be a first trapezoid in a shape of a trapezoid. The first trapezoid has a first lower bottom close to the base substrate, a first upper bottom away from the base substrate, and two first side edges connecting the first lower bottom and the first upper bottom respectively. A first width B1 of the first upper bottom may be greater than or equal to 15 and a first slope angle β1 of a first side edge may be about 30° to 70°.

In an exemplary implementation mode, a first height H1 of the first pixel definition structure 10 may be greater than a second height H2 of the second pixel definition structure 20.

In an exemplary implementation mode, the first height H1 of the first pixel definition structure 10 may be about 1.0 μm to 2.0 μm.

In an exemplary implementation mode, in the second direction D2, a distance between adjacent first pixel definition structures 10 may be determined based on factors such as a pixel size and a minimum diameter of an ink droplet, and the distance between adjacent first pixel definition structures 10 is greater than the minimum diameter of the ink droplet. For example, the distance between adjacent first pixel definition structures 10 may be greater than or equal to 12 μm.

In an exemplary implementation mode, an orthographic projection of the anode via in the drive circuit layer 102 on the base substrate may be located within a range of an orthographic projection of the first pixel definition structure 10 on the base substrate so that a region where the anode via is located is covered by the first pixel definition structure 10, which may ensure flatness of the anode.

So far, preparation of a pixel definition structure according to an exemplary embodiment of the present disclosure is completed. The pixel definition structure includes three layers of pixel definition structures, i.e., a first pixel definition structure 10, a second pixel definition structure 20, and a third pixel definition structure 30. An ink storage space is formed between adjacent first pixel definition structures 10. The first pixel definition structure 10 and the second pixel definition structure 20 which are intersected form an open region of a sub-pixel. The second pixel definition structure 20 and the third pixel definition structure 30 which are intersected form a light emitting region of a sub-pixel that exposes the anode 301. A surface of the third pixel definition structure 30 located on the anode 301 on a side away from the anode, the first pixel definition structure 10 located on one side of the third pixel definition structure 30, and the second pixel definition structure 20 located on the other side of the third pixel definition structure 30 form an ink channel in which ink flows, so that the ink may flow between an open region of sub-pixels adjacent in the first direction D1.

In an exemplary implementation mode, materials of the first pixel definition structure, the second pixel definition structure, and the third pixel definition structure may be lyophobic organic materials, lyophobic property of the first pixel definition structure may be stronger than that of the second pixel definition structure, and lyophobic property of the second pixel definition structure may be stronger than that of the third pixel definition structure.

In an exemplary implementation mode, a lyophobic organic material may be a hydrophobic and oleophilic material, such as polyimide, polysiloxane, polymethyl methacrylate, polybutyl methacrylate, polycyclohexyl methacrylate, or polystyrene. Or, the lyophobic organic material may be a hydrophobic and oleophobic material, such as polyhexafluoropropylene, fluorinated parylene, fluorinated polysilyl ether, fluorinated polyimide, or fluorinated polyamide, which is not limited in the present disclosure.

In an exemplary implementation mode, a material of the third pixel definition structure may be a lyophilic inorganic material, or a lyophilic organic material. For example, the lyophilic organic material may be any one or more of Silicon Oxide (SiOx), Silicon Nitride (SiNx), and Silicon OxyNitride (SiON), and may be of a single layer, a multi-layer, or a composite layer.

In an exemplary implementation mode, in a plane parallel to the display substrate, a shape of a light emitting region of a sub-pixel defined by the second pixel definition structure 20 and the third pixel definition structure 30 may be a triangle, a rectangle, a polygon, a circle, or a ellipse, etc., which is not limited in the present disclosure.

In an exemplary implementation mode, a pattern of a post spacer may be formed in a process of forming a pattern of a first pixel definition structure, which is not limited in the present disclosure.

(17) Forming a pattern of an organic emitting layer. In an exemplary implementation mode, the forming the pattern of the organic emitting layer may include following operations.

Figure 14:
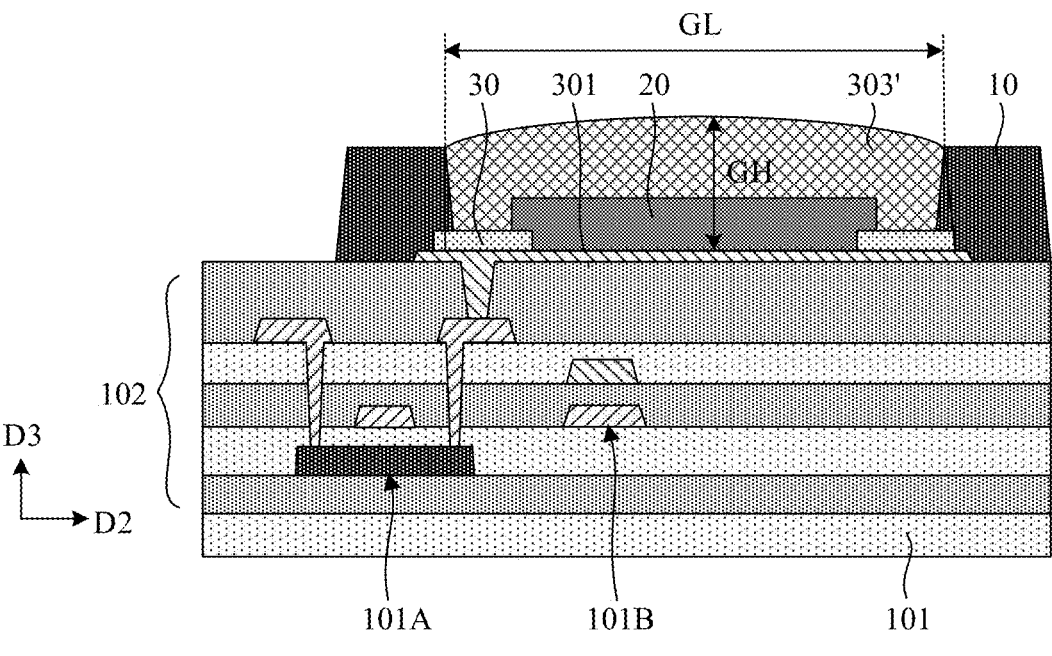
FIG. 14 is a schematic diagram after inkjet printing according to an exemplary embodiment of the present disclosure.

A. On the base substrate on which the aforementioned patterns are formed, ink 303' of an organic light emitting material is printed using an inkjet printing mode so that the ink 303' is filled between adjacent first pixel definition structures 10, as shown in FIG. 14.

In an exemplary implementation mode, between adjacent first pixel definition structures 10, a surface of the ink 303' on a side away from the base substrate is arched, and the ink 303' completely covers the second pixel definition structure 20 and the third pixel definition structure 30, i.e., the second pixel definition structure 20 and the third pixel definition structure 30 are below an upper surface of the ink 303'.

In an exemplary implementation mode, an arch height GH of the arched ink is related to an ink amount of the and lyophobic property of the first pixel definition structure, the more the ink amount is, the higher the arch height GH is, the stronger the lyophobic property of the first pixel definition structure is, and the higher the arch height is. In an exemplary implementation mode, the arch height GH may be less than or equal to half of a first pitch GL, which is a pitch between adjacent first pixel definition structures in the second direction D2.

In an exemplary implementation mode, lyophobic property of a surface of the first pixel definition structure 10 on a side away from the base substrate is slightly weak, and the ink 303' may have certain stretch on the surface of the first pixel definition structure 10 on the side away from the base substrate.

Figure 15:
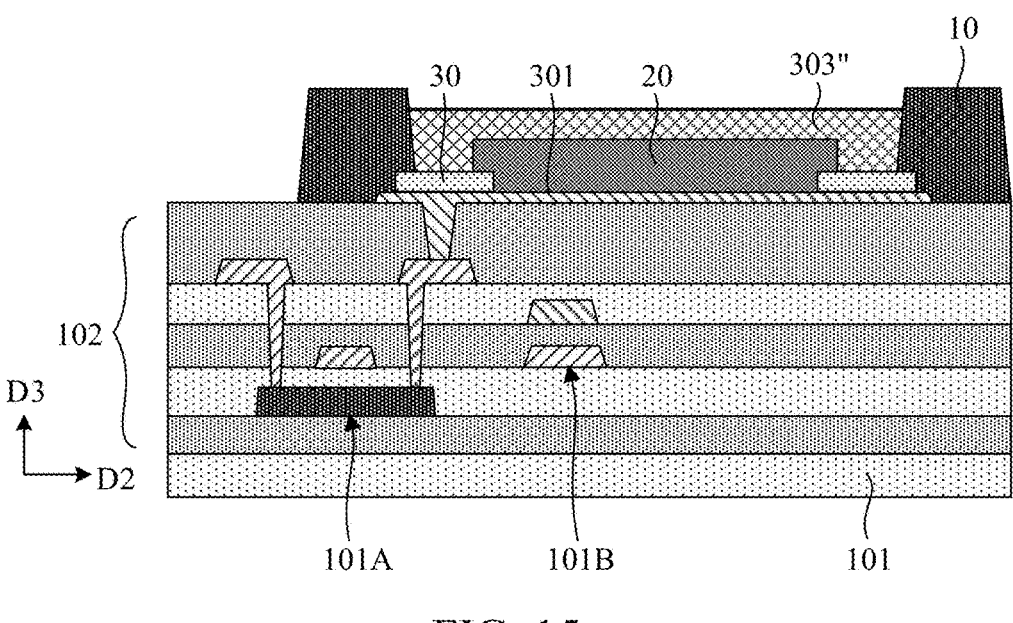
FIG. 15 is a schematic diagram of an early stage of ink drying according to an exemplary embodiment of the present disclosure.
Figure 16:
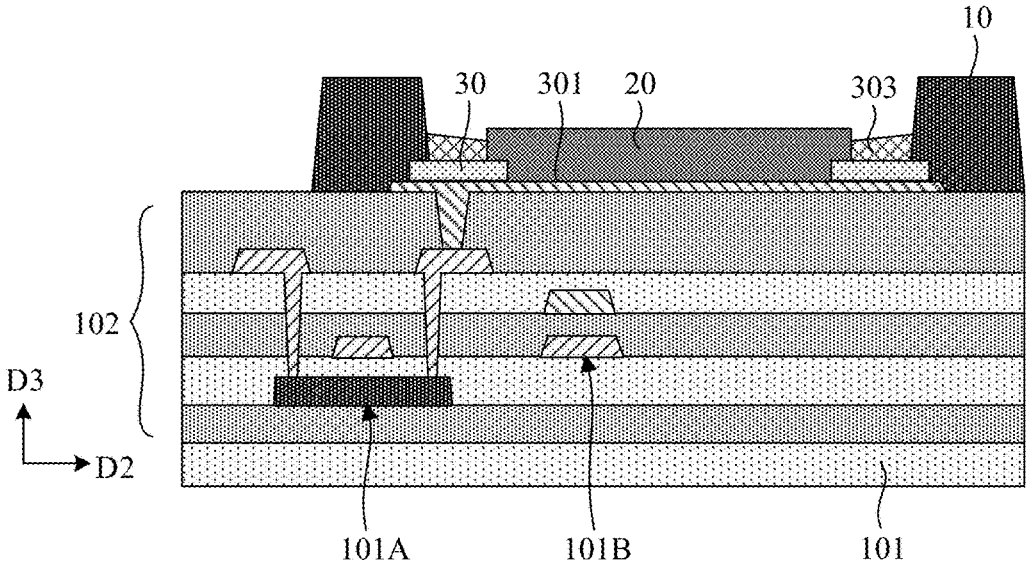
FIG. 16 is a schematic diagram after ink is dried to form a pattern of an organic emitting layer according to an exemplary embodiment of the present disclosure.

B. The ink is dried through a drying process so that the ink is gradually dried. At an early stage of ink drying, a surface of the ink on a side away from the base substrate is gradually changed from an arch to a flat surface, to form semi-dry ink 303", and the semi-dry ink 303" still completely covers the second pixel definition structure 20 and the third pixel definition structure 30, as shown in FIG. 15. At a later stage of ink drying, since ink located in a region where the second pixel definition structure 20 is located is supported, while ink located in a region between the first pixel definition structure 10 and the second pixel definition structure 20 is not supported, the second pixel definition structure 20 forms a column-shaped protrusion in a process of further drying of the ink, so that the second pixel definition structure 20 is easily exposed. Finally the ink is dried completely to form the organic emitting layer 303, and the second pixel definition structure 20 separates ink in a light emitting region of adjacent sub-pixels, as shown in FIG. 16.

In an exemplary implementation mode, the organic emitting layer 303 covers the third pixel definition structure 30, i.e., the third pixel definition structure 30 is below an upper surface (a surface on a side away from the base substrate) of the organic emitting layer 303.

In an exemplary implementation mode, since the pixel definition structure forms an ink channel in which ink flows, a direction of force on the ink is oriented towards a direction of the ink channel in a process of ink drying, thus improving a phenomenon of ink climbing-slope. There is still some climbing-slope around the first pixel definition structure 10 in the process of ink drying, so that a thickness of the organic emitting layer 303 close to an edge region of the first pixel definition structure 10 is greater than a thickness of the organic emitting layer 303 away from a middle region of the first pixel definition structure 10, however, since the organic emitting layer 303 in the edge region is formed on the third pixel definition structure 30, the organic emitting layer 303 in an edge region of the first pixel definition structure 10 is not in contact with the anode, the organic emitting layer 303 in the edge region does not emit light, therefore, the organic light-emitting layer 303 in a relatively thick edge region will not affect display effect after a light emitting device is lit, and a problem of uneven display brightness caused by different film thicknesses is avoided.

In an exemplary implementation mode, the organic emitting layer may include a Hole Injection Layer (HIL), a Hole Transport Layer (HTL), an Electron Block Layer (EBL), an Emitting Layer (EML), a Hole Block Layer (HBL), an Electron Transport Layer (ETL), and an Electron Injection Layer (EIL) that are stacked. In an exemplary implementation mode, hole injection layers of all sub-pixels may be a common layer connected together, electron injection layers of all the sub-pixels may be a common layer connected together, hole transport layers of all the sub-pixels may be a common layer connected together, electron transport layers of all the sub-pixels may be a common layer connected together, hole block layers of all the sub-pixels may be a common layer connected together, emitting layers of adjacent sub-pixels may be overlapped slightly or may be isolated from each other, and electron block layers of adjacent sub-pixels may be overlapped slightly or may be isolated from each other.

A subsequent preparation process may include formation of a cathode, an encapsulation layer, and other structures, which is not limited in the present disclosure.

Figure 17:
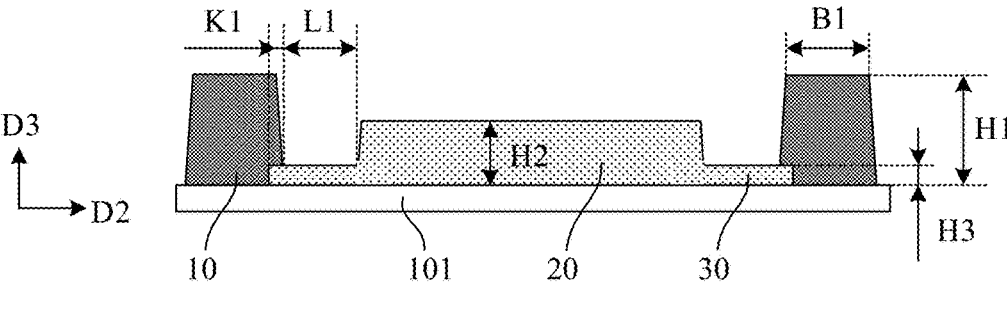
FIG. 17 is a structure of another pixel definition layer according to an exemplary embodiment of the present disclosure.

FIG. 17 is a structure of another pixel definition layer according to an exemplary embodiment of the present disclosure, and FIG. 17 is a cross-sectional view taken along an A-A direction in FIG. 6c. In an exemplary implementation mode, a main structure of a pixel definition layer according to the exemplary embodiment is similar to the structure shown in FIG. 7 and FIG. 8, and a pixel definition layer in a sub-pixel may include a first pixel definition structure 10, a second pixel definition structure 20, and a third pixel definition structure 30. The first pixel definition structure 10 and the second pixel definition structure 20 which are intersected form an open region of the sub-pixel. The second pixel definition structure 20 and the third pixel definition structure 30 which are intersected form a light emitting region of the sub-pixel. A difference is that the second pixel definition structure 20 and the third pixel definition structure 30 according to the exemplary embodiment are interconnected to be of an integral structure and formed simultaneously through a same patterning process, as shown in FIG. 17.

In an exemplary implementation mode, structures of the first pixel definition structure 10, the second pixel definition structure 20, and the third pixel definition structure 30 may be similar to structures according to an aforementioned embodiment, and relevant parameters such as a first distance L1, a first overlap width K1, a first width B1, a first height H1, a second height H2, and a third height H3 may be similar to those in the structures according to the aforementioned embodiment. A difference is that the second pixel definition structure 20 and the third pixel definition structure 30 are connected into a whole, and there is no second overlap region of the aforementioned embodiment.

In an exemplary implementation mode, the third pixel definition structure 30 may be at least partially overlapped with the first pixel definition structure 10, and there is a first overlap region between an orthographic projection of the third pixel definition structure 30 on a base substrate and an orthographic projection of the first pixel definition structure 10 on the base substrate. In an exemplary implementation mode, a height change between the second pixel definition structure 20 and the third pixel definition structure 30 may be a step structure with an abrupt height change. In a second direction D2, there is a height change demarcation line between the second pixel definition structure 20 with a second height H2 and the third pixel definition structure 30 with a third height H3, and there is a first distance L1 between a first edge of the first pixel definition structure 10 on a side close to the second pixel definition structure 20 and the height change demarcation line.

In an exemplary implementation mode, a preparation process of a display substrate according to the exemplary embodiment may include following operations.

(21) to (23) Processes of forming the base substrate, a driver circuit layer, and a pattern of an anode are similar to those of preparation flows (11) to (13) according to the aforementioned embodiment and will not be repeated here.

(24) Forming patterns of a second pixel definition structure and a third pixel definition structure. In an exemplary implementation mode, forming the patterns of the second pixel definition structure and the third pixel definition structure may include: coating a pixel definition thin film on the base substrate on which the aforementioned patterns are formed, patterning the pixel definition thin film using a patterning process with a halftone or gray tone mask plate to form the patterns of the second pixel definition structure and the third pixel definition structure, the second pixel definition structure 20 has a long strip shape extending along the second direction D2, a plurality of second pixel definition structures 20 are disposed sequentially along a first direction D1, and the third pixel definition structure 30 has a long strip shape extending along the first direction D1 and is disposed on both sides of the second pixel definition structure 20 in the second direction D2 respectively, and a second pixel definition structure 20 and a pixel definition structure 30 which are intersected form a light emitting region of a sub-pixel.

In an exemplary implementation mode, this process may include a surface treatment process, a surface of the second pixel definition structure and/or a surface of the third pixel definition structure are treated, so that lyophobic property of the second pixel definition structure is stronger than lyophobic property of the third pixel definition structure, or so that a surface of the second pixel definition structure has lyophobic property while a surface of the third pixel definition structure has hydrophilicity.

(25) to (26) Forming a first pixel definition structure and a pattern of an organic emitting layer, which may be similar to processes of preparation flows (16) to (17) of the aforementioned embodiment and will not be repeated here.

Pixel definition structures according to the exemplary embodiment form an ink channel in which ink flows, thus improving a phenomenon of ink climbing-slope and avoiding a problem of uneven display brightness caused by different film thicknesses. According to this exemplary embodiment, the second pixel definition structure and the third pixel definition structure are formed simultaneously using a same patterning process, thus simplifying a process, shortening process time, and a production cost may be effectively reduced.

Figures 18, 19, 20, 21:
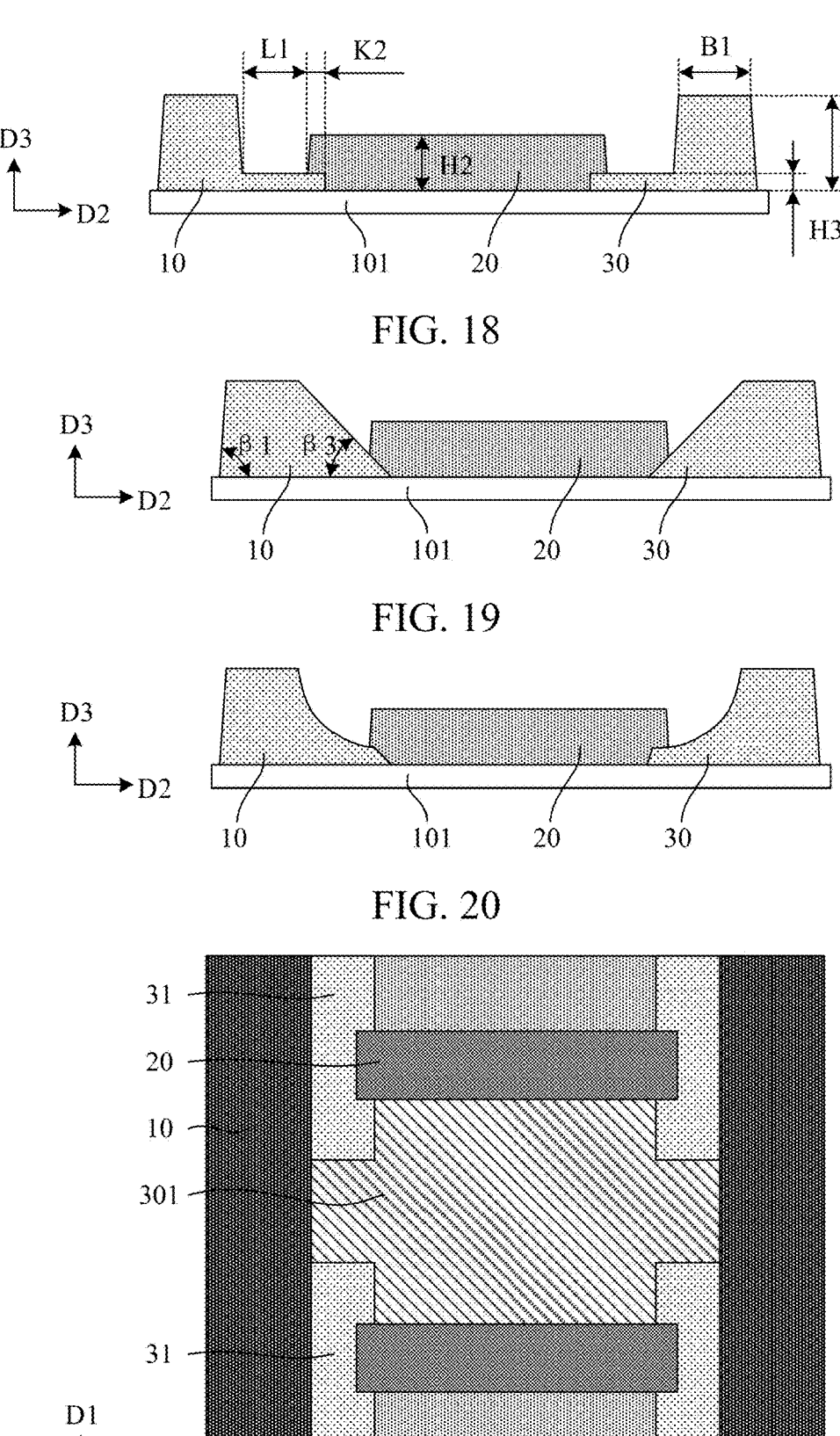
FIG. 18 is a structure of yet another pixel definition layer according to an exemplary embodiment of the present disclosure.
FIG. 19 is a structure of yet another pixel definition layer according to an exemplary embodiment of the present disclosure.
FIG. 20 is a structure of yet another pixel definition layer according to an exemplary embodiment of the present disclosure.
FIG. 21 is a structure of yet another pixel definition layer according to an exemplary embodiment of the present disclosure.

FIG. 18 is a structure of yet another pixel definition layer according to an exemplary embodiment of the present disclosure, and FIG. 18 is a cross-sectional view taken along an A-A direction in FIG. 6c. In an exemplary implementation mode, a main structure of the pixel definition layer according to the exemplary embodiment is similar to the structure shown in FIG. 7 and FIG. 8, and a pixel definition layer in a sub-pixel may include a first pixel definition structure 10, a second pixel definition structure 20, and a third pixel definition structure 30. The first pixel definition structure 10 and the second pixel definition structure 20 which are intersected form an open region of the sub-pixel. The second pixel definition structure 20 and the third pixel definition structure 30 which are intersected form a light emitting region of the sub-pixel. A difference is that the first pixel definition structure 10 and the third pixel definition structure 30 according to the exemplary embodiment are interconnected to be of an integral structure and formed simultaneously through a same patterning process, as shown in FIG. 18.

In an exemplary implementation mode, structures of the first pixel definition structure 10, the second pixel definition structure 20, and the third pixel definition structure 30 may be similar to structures according to the aforementioned embodiment, and relevant parameters such as a first distance L1, a second overlap width K2, a first width B1, a first height H1, a second height H2, a third height H3 may be similar to those in the structures according to the aforementioned embodiment. A difference is that the first pixel definition structure 10 and the third pixel definition structure 30 are connected into a whole, and there is no first overlap region of the aforementioned embodiment.

In an exemplary implementation mode, the third pixel definition structure 30 may be at least partially overlapped with the second pixel definition structure 20, and there is a second overlap region between an orthographic projection of the third pixel definition structure 30 on a base substrate and an orthographic projection of the second pixel definition structure 20 on the base substrate. In an exemplary implementation mode, a height change between the first pixel definition structure 10 and the third pixel definition structure 30 may be a step structure with an abrupt height change. In a second direction D2, there is a height change demarcation line between the first pixel definition structure 10 with a first height H1 and the third pixel definition structure 30 with a third height H3, and there is a first distance L1 between the height change demarcation line and a first end face of the second pixel definition structure 20 close to the first pixel definition structure 10.

In an exemplary implementation mode, a preparation process of a display substrate according to the exemplary embodiment may include following operations.

(31) to (33) Processes of forming the base substrate, a driver circuit layer, and a pattern of an anode are similar to those of (11) to (13) according to the aforementioned embodiment and will not be repeated here.

(34) Forming patterns of a first pixel definition structure and a third pixel definition structure. In an exemplary implementation mode, forming the patterns of the first pixel definition structure and the third pixel definition structure may include: coating a pixel definition thin film on the base substrate on which the aforementioned patterns are formed, patterning the pixel definition thin film using a patterning process with a halftone or gray tone mask plate to form the patterns of the first pixel definition structure and the third pixel definition structure.

Both the first pixel definition structure 10 and the third pixel definition structure 30 have a long strip shape extending along a first direction D1, and the third pixel definition structure 30 is provided on one side or both sides of the first pixel definition structure 10 in the second direction D2, respectively.

In an exemplary implementation mode, this process may include a surface treatment process, a surface of the first pixel definition structure and/or a surface of the third pixel definition structure are treated, so that lyophobic property of the first pixel definition structure is stronger than that of the third pixel definition structure, or so that a surface of the first pixel definition structure has lyophobic property while a surface of the third pixel definition structure has hydrophilicity.

(35) to (36) Forming a second pixel definition structure and a pattern of an organic emitting layer, forming the second pixel definition structure may be similar to a process of a preparation flow (15) according to the aforementioned embodiment, and forming the pattern of the organic emitting layer may be similar to a process of a preparation flow (17) according to the aforementioned embodiment, which will not be repeated here.

Pixel definition structures according to the exemplary embodiment form an ink channel in which ink flows, thus improving a phenomenon of ink climbing-slope and avoiding a problem of uneven display brightness caused by different film thicknesses. According to this exemplary embodiment, the first pixel definition structure and the third pixel definition structure are formed simultaneously using a same patterning process, thus simplifying a process, shortening process time, and a production cost may be effectively reduced.

FIG. 19 is a structure of yet another pixel definition layer according to an exemplary embodiment of the present disclosure, and FIG. 19 is a cross-sectional view taken along an A-A direction in FIG. 6c. In an exemplary implementation mode, a main structure of the pixel definition layer according to the exemplary embodiment is similar to the structure shown in FIG. 18, a difference is that a height change between a first pixel definition structure 10 and a third pixel definition structure 30 according to the exemplary embodiment is a gently changing slope structure, as shown in FIG. 19.

In an exemplary implementation mode, a first side edge of the first pixel definition structure 10 on a side away from a second pixel definition structure 20 has a first slope angle β1, a third side edge of the third pixel definition structure 30 away from the first side edge has a third slope angle β3, and the first slope angle β1 may be greater than the third slope angle β3.

FIG. 20 is a structure of yet another pixel definition layer according to an exemplary embodiment of the present disclosure, and FIG. 20 is a cross-sectional view taken along an A-A direction in FIG. 6c. In an exemplary implementation mode, a main structure of the pixel definition layer according to the exemplary embodiment is similar to the structure shown in FIG. 18, a difference is that a height change between a first pixel definition structure 10 and a third pixel definition structure 30 according to the exemplary embodiment is a gently changing slope structure, and a side edge of the first pixel definition structure 10 on a side towards a second pixel definition structure 20 is an arc, as shown in FIG. 20.

In an exemplary implementation mode, a side edge of the first pixel definition structure 10 on a side towards the second pixel definition structure 20 may be a plurality of bending lines connected sequentially.

FIG. 21 is a structure of yet another pixel definition layer according to an exemplary embodiment of the present disclosure. In an exemplary implementation mode, a main structure of the pixel definition layer according to the exemplary embodiment is similar to the structure shown in FIG. 7 and FIG. 8, and a pixel definition layer in a sub-pixel may include a first pixel definition structure 10, a second pixel definition structure 20, and a third pixel definition structure 30. A difference is that the third pixel definition structure 30 according to the exemplary embodiment includes at least two mutually isolated sub-definition structures 31 sequentially arranged along a first direction D1, as shown in FIG. 21.

In an exemplary implementation mode, structures and related parameters of the first pixel definition structure 10 and the second pixel definition structure 20 may be similar to those of the aforementioned embodiment. There is a first overlap region between an orthographic projection of each sub-definition structure 31 on a base substrate and an orthographic projection of the first pixel definition structure 10 on the base substrate, and there is a second overlap region between an orthographic projection of each sub-definition structure 31 on the base substrate and an orthographic projection of the second pixel definition structure 20 on the base substrate.

Pixel definition structures according to the exemplary embodiment form an ink channel in which ink flows, thus improving a phenomenon of ink climbing-slope and avoiding a problem of uneven display brightness caused by different film thicknesses. According to the exemplary embodiment, the third pixel definition structure is set as mutually isolated sub-definition structures, which may increase an area of a light emitting region of a sub-pixel and improve an aperture ratio.

Figure 22:
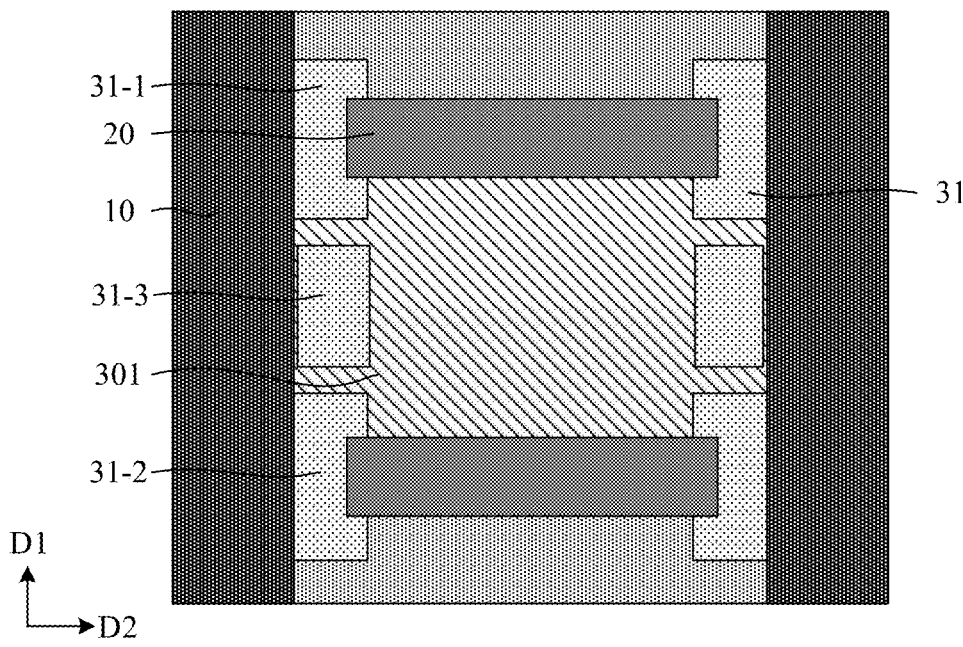
FIG. 22 is a structure of yet another pixel definition layer according to an exemplary embodiment of the present disclosure.

FIG. 22 is a structure of yet another pixel definition layer according to an exemplary embodiment of the present disclosure. In an exemplary implementation mode, a main structure of the pixel definition layer according to the exemplary embodiment is similar to the structure shown in FIG. 21, and a pixel definition layer in a sub-pixel may include a first pixel definition structure 10, a second pixel definition structure 20, and a third pixel definition structure 30. A difference is that the third pixel definition structure 30 according to the exemplary embodiment includes three mutually isolated sub-definition structures 31 arranged sequentially along a first direction D1, as shown in FIG. 22.

In an exemplary implementation mode, structures and related parameters of the first pixel definition structure 10 and the second pixel definition structure 20 may be similar to those of the aforementioned embodiment. There are a first overlap region and a second overlap region between an orthographic projection of a first sub-definition structure 31-1 on the base substrate and orthographic projections of the first pixel definition structure 10 and the second pixel definition structure 20 on the base substrate, respectively. There are a first overlap region and a second overlap region between an orthographic projection of a second sub-definition structure 31-2 on the base substrate and orthographic projections of the first pixel definition structure 10 and the second pixel definition structure 20 on the base substrate, respectively. The first sub-definition structure 31-1 is located on a side of the second sub-definition structure 31-2 in the first direction D1.

In an exemplary implementation mode, a third sub-definition structure 31-3 is located between the first sub-definition structure 31-1 and the second sub-definition structure 31-2, and an orthographic projection of the third sub-definition structure 31-3 on the base substrate is not overlapped with an orthographic projection of the second pixel definition structure 20 on the base substrate.

In an exemplary implementation mode, there may be an overlap region between the orthographic projection of the third sub-definition structure 31-3 on the base substrate and an orthographic projection of the first pixel definition structure 10 on the base substrate, or, the orthographic projection of the third sub-definition structure 31-3 on the base substrate may not be overlapped with an orthographic projection of the first pixel definition structure 10 on the base substrate.

Figure 23:
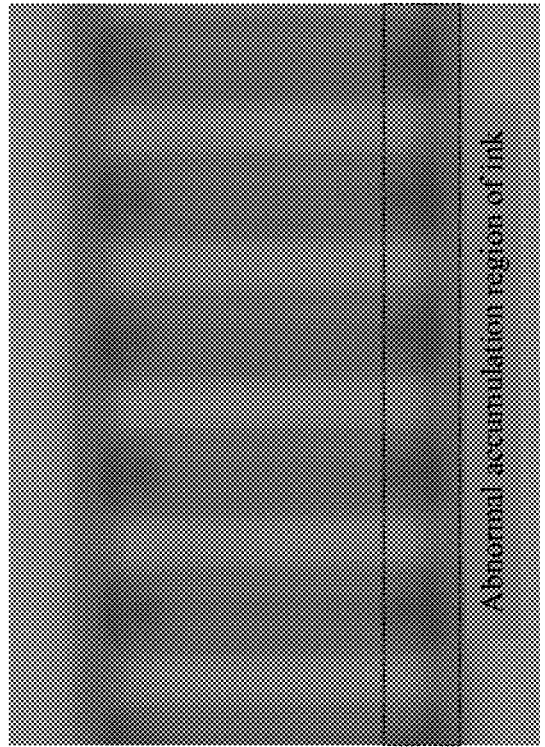
FIG. 23 is a display effect diagram after a light emitting device of a display substrate is lit.
Figure 24:
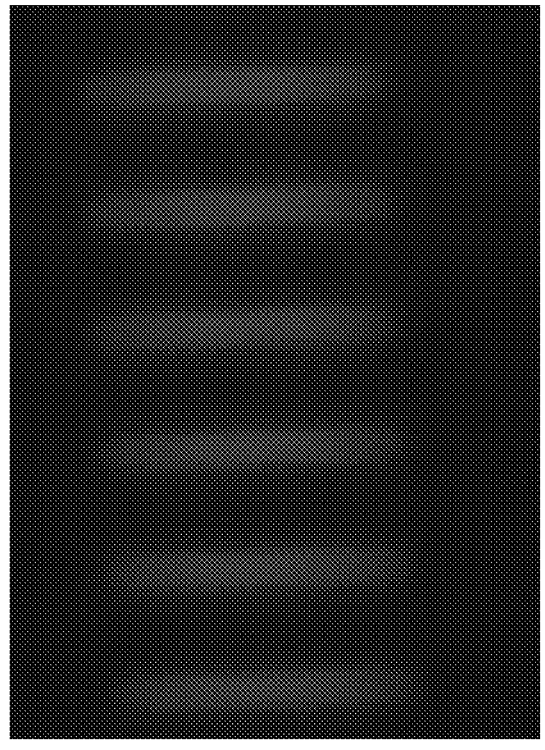
FIG. 24 is a display effect diagram after a light emitting device of a display substrate is lit according to an exemplary embodiment of the present disclosure.

FIG. 23 is a display effect diagram after a light emitting device of a display substrate is lit, and FIG. 24 is a display effect diagram after a light emitting device of a display substrate is lit according to an exemplary embodiment of the present disclosure. In a display substrate, a pixel definition structure is composed of a first pixel definition structure and a second pixel definition structure, and the second pixel definition structure separates an organic emitting layer in an open region of adjacent sub-pixels. Since a phenomenon of climbing-slope exists at edges of the first pixel definition structure and the second pixel definition structure during an ink drying process, thicknesses of an organic emitting layer formed after drying are different, a thickness of the organic emitting layer close to edge regions of the first pixel definition structure and the second pixel definition structure is obviously greater than a thickness of the organic emitting layer in other positions. Different film thicknesses of the organic emitting layer at different positions will eventually be reflected in a display effect after a light emitting device is lit, so that brightness of an edge region of a pixel definition structure is greater than that at other positions, especially brightness of an edge region of the first pixel definition structure is greater than that at other positions, as shown in an abnormal accumulation region of ink in FIG. 17.

In an exemplary implementation mode of the present disclosure, by providing a third pixel definition structure, the third pixel definition structure is used for forming a channel in which ink flows together with a first pixel definition structure and a second pixel definition structure, so that not only the third pixel definition structure may achieve a function of guiding flow in an edge region of the first pixel definition structure and a thickness of the organic emitting layer in the edge region of the first pixel definition structure is effectively reduced, but also isolation of the organic emitting layer from an anode in the edge region of the first pixel definition structure is achieved, and an influence of the organic emitting layer in the edge region of the first pixel definition structure on a light emitting effect is effectively eliminated. After the light emitting device is lit, brightness of the edge region of the first pixel definition structure is obviously reduced. Compared with an existing structure, the exemplary embodiment of the present disclosure effectively reduces brightness of an edge region of a pixel definition structure, improves display uniformity, and enhances display quality. According to the exemplary embodiment of the present disclosure, it does not need to change an existing process flow or existing process equipment for preparing a display substrate, which has good process compatibility, high process achievability, strong practicability, a simple method, an obvious effect, and good application prospect.

The structure shown in the present disclosure and the preparation process thereof are merely exemplary description. In an exemplary implementation mode, a corresponding structure may be altered and patterning processes may be increased or reduced according to actual needs. For example, the first pixel definition structure and the second pixel definition structure may be formed simultaneously using a single patterning process, followed by a hydrophobic treatment. For another example, the third pixel definition structure may be not overlapped with the first pixel definition structure, and the third pixel definition structure may be not overlapped with the second pixel definition structure. For another example, other electrodes or leads may further be disposed in the driving structure layer and the light emitting structure layer, which is not limited here in the present disclosure.

In an exemplary implementation mode, the display substrate of the present disclosure may be applied to a display apparatus with a pixel drive circuit, such as an OLED, a Quantum dot display (QLED), a Light Emitting Diode display (Micro LED or Mini LED), or a Quantum Dot Light Emitting Diode display (QDLED), which is not limited here in the present disclosure.

An exemplary embodiment of the present disclosure also provides a preparation method of a display substrate. In an exemplary implementation mode, the preparation method of the display substrate may include following acts.

A pixel definition layer is formed on a base substrate; the pixel definition layer includes a plurality of first pixel definition structures, a plurality of second pixel definition structures, and a plurality of third pixel definition structures; a first pixel definition structure has a long strip shape extending along a first direction, the plurality of first pixel definition structures are arranged sequentially along a second direction, the first direction and the second direction are intersected; a second pixel definition structure has a long strip shape extending along the second direction, the plurality of second pixel definition structures are disposed at intervals between adjacent first pixel definition structures; at least one third pixel definition structure is disposed between the first pixel definition structure and the second pixel definition structure; a height of the third pixel definition structure is less than a height of the second pixel definition structure in a direction perpendicular to the base substrate.

An exemplary embodiment of the present disclosure also provides a display apparatus, including the aforementioned display substrate. The display apparatus may be any product or component with a display function such as a mobile phone, a tablet computer, a television, a display, a laptop computer, a digital photo frame, and a navigator.

Although implementation modes disclosed in the present disclosure are described as above, the described contents are only implementation modes adopted for convenience of understanding of the present disclosure, but are not intended to limit the present disclosure. Any person skilled in the art to which the present disclosure pertains may make any modifications and variations in a form and details of implementation without departing from the spirit and scope disclosed in the present disclosure. However, the scope of patent protection of the present disclosure shall still be subject to the scope defined in the appended claims.

The invention claimed is:

1. A display substrate, comprising a base substrate and a pixel definition layer disposed on the base substrate; wherein the pixel definition layer comprises a plurality of first pixel definition structures, a plurality of second pixel definition structures, and a plurality of third pixel definition structures; a first pixel definition structure has a long strip shape extending along a first direction, the plurality of first pixel definition structures are arranged sequentially along a second direction, and the first direction and the second direction are intersected; a second pixel definition structure has a long strip shape extending along the second direction, the plurality of second pixel definition structures are disposed at intervals between adjacent first pixel definition structures; at least one third pixel definition structure is provided between the first pixel definition structure and the second pixel definition structure; a height of the third pixel definition structure is less than a height of the second pixel definition structure in a direction perpendicular to the base substrate, wherein lyophobic property of the first pixel definition structure is stronger than that of the third pixel definition structure; and the first pixel definition structure is lapped joint and disposed at an edge of the third pixel definition structure on a side close to the first pixel definition structure, and the second pixel definition structure is lapped joint and disposed at an edge of the third pixel definition structure on a side away from the first pixel definition structure.

2. The display substrate according to claim 1, wherein the height of the second pixel definition structure is less than a height of the first pixel definition structure in the direction perpendicular to the base substrate.

3. The display substrate according to claim 1, wherein a height of the first pixel definition structure is 1.0 μm to 2.0 μm in the direction perpendicular to the base substrate.

4. The display substrate according to claim 1, wherein the height of the second pixel definition structure is 0.3 μm to 0.8 μm in the direction perpendicular to the base substrate.

5. The display substrate according to claim 1, wherein the height of the third pixel definition structure is 0.1 μm to 0.3 μm in the direction perpendicular to the base substrate.

6. The display substrate according to claim 1, wherein there is a first distance between an edge of the first pixel definition structure close to the second pixel definition structure and an end face of the second pixel definition structure close to the first pixel definition structure, and the first distance is greater than or equal to 2 μm.

7. The display substrate according to claim 1, wherein in a plane perpendicular to the first direction, a cross-sectional shape of the first pixel definition structure is a first trapezoid, a width of an upper bottom of the first trapezoid is greater than or equal to 15 μm, and a first slope angle of a side edge of the first trapezoid is 30° to 70°; in a plane perpendicular to the second direction, a cross-sectional shape of the second pixel definition structure is a second trapezoid, a width of an upper bottom of the second trapezoid is greater than or equal to 3 μm, and a second slope angle of a side edge of the second trapezoid is 30° to 90°.

8. The display substrate according to claim 1, wherein the lyophobic property of the first pixel definition structure is stronger than that of the second pixel definition structure and the lyophobic property of the second pixel definition structure is stronger than that of the third pixel definition structure.

9. The display substrate according to claim 1, wherein a material of the third pixel definition structure comprises a lyophilic inorganic material, or comprises a lyophilic organic material.

10. The display substrate according to claim 1, wherein there is a first overlap region between an orthographic projection of the first pixel definition structure on the base substrate and an orthographic projection of the third pixel definition structure on the base substrate, and a first overlap width of the first overlap region is 1 μm to 3 μm in the second direction.

11. The display substrate according to claim 1, wherein there is a second overlap region between an orthographic projection of the second pixel definition structure on the base substrate and an orthographic projection of the third pixel definition structure on the base substrate, and a second overlap width of the second overlap region is 1 μm to 3 μm in the second direction.

12. The display substrate according to claim 1, wherein the first pixel definition structure and the third pixel definition structure are interconnected to be of an integral structure.

13. The display substrate according to claim 12, wherein a first side edge of the first pixel definition structure on a side away from the second pixel definition structure has a first slope angle, a third side edge of the first pixel definition structure on a side away from the first side edge has a third slope angle, and the first slope angle is greater than the third slope angle.

14. The display substrate according to claim 1, wherein the second pixel definition structure and the third pixel definition structure are interconnected to be of an integral structure.

15. The display substrate according to claim 1, wherein the third pixel definition structure comprises at least two mutually isolated sub-definition structures, the at least two sub-definition structures are arranged sequentially along the first direction.

16. The display substrate according to claim 15, wherein an orthographic projection of at least one sub-definition structure on the base substrate is at least partially overlapped with an orthographic projection of the first pixel definition structure on the base substrate, and/or an orthographic projection of at least one sub-definition structure on the base substrate is at least partially overlapped with an orthographic projection of the second pixel definition structure on the base substrate.

17. The display substrate according to claim 15, wherein an orthographic projection of at least one sub-definition structure on the base substrate is not overlapped with an orthographic projection of the first pixel definition structure on the base substrate, and/or an orthographic projection of at least one sub-definition structure on the base substrate is not overlapped with an orthographic projection of the second pixel definition structure on the base substrate.

18. The display substrate according to claim 1, wherein the display substrate further comprises an organic emitting layer, the organic emitting layer is disposed within an open region defined by the first pixel definition structure and the second pixel definition structure, and the organic emitting layer covers the third pixel definition structure.

19. A display apparatus, comprising a display substrate according to claim 1.

20. A preparation method of a display substrate, comprising:

forming a pixel definition layer on a base substrate; wherein the pixel definition layer comprises a plurality of first pixel definition structures, a plurality of second pixel definition structures, and a plurality of third pixel definition structures; a first pixel definition structure has a long strip shape extending along a first direction, the plurality of first pixel definition structures are arranged sequentially along a second direction, and the first direction and the second direction are intersected; a second pixel definition structure has a long strip shape extending along the second direction, the plurality of second pixel definition structures are disposed at intervals between adjacent first pixel definition structures; at least one third pixel definition structure is disposed between the first pixel definition structure and the second pixel definition structure; a height of the third pixel definition structure is less than a height of the second pixel definition structure in a direction perpendicular to the base substrate, wherein lyophobic property of the first pixel definition structure is stronger than that of the third pixel definition structure; and the first pixel definition structure is lapped joint and disposed at an edge of the third pixel definition structure on a side close to the first pixel definition structure, and the second pixel definition structure is lapped joint and disposed at an edge of the third pixel definition structure on a side away from the first pixel definition structure.

* * * * *